US011328629B2

(12) United States Patent
Lee et al.

(10) Patent No.: US 11,328,629 B2
(45) Date of Patent: May 10, 2022

(54) STRETCHABLE DISPLAY DEVICE

(71) Applicant: LG Display Co., Ltd., Seoul (KR)

(72) Inventors: MyoungHo Lee, Seoul (KR); Kihan Kim, Gimpo-si (KR); Hyokang Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 190 days.

(21) Appl. No.: 16/922,545

(22) Filed: Jul. 7, 2020

(65) Prior Publication Data

US 2021/0027671 A1 Jan. 28, 2021

(30) Foreign Application Priority Data

Jul. 25, 2019 (KR) .................. 10-2019-0090049

(51) Int. Cl.
*H01L 51/00* (2006.01)
*G09F 9/30* (2006.01)
*H01L 27/32* (2006.01)

(52) U.S. Cl.
CPC .......... *G09F 9/301* (2013.01); *H01L 27/3276* (2013.01); *H01L 51/0097* (2013.01); *H01L 2251/5338* (2013.01)

(58) Field of Classification Search
CPC ............. H01L 27/3276; H01L 51/0097; H01L 2251/5338
USPC .................................................. 361/679.01
See application file for complete search history.

(56) References Cited

U.S. PATENT DOCUMENTS

| 9,391,286 | B1* | 7/2016 | Kwon | H01L 51/5275 |
| 2002/0094701 | A1* | 7/2002 | Biegelsen | B25J 13/084 |
| | | | | 439/32 |
| 2014/0299362 | A1* | 10/2014 | Park | H05K 1/0283 |
| | | | | 174/254 |
| 2017/0005077 | A1* | 1/2017 | Kim | G06F 1/1643 |
| 2017/0181277 | A1* | 6/2017 | Tomita | H05K 1/0283 |
| 2018/0046221 | A1* | 2/2018 | Choi | G02B 26/0825 |
| 2020/0074923 | A1* | 3/2020 | Zhou | G06F 1/1652 |

FOREIGN PATENT DOCUMENTS

| KR | 20140026189 A | 3/2014 |
| KR | 20180076858 A | 7/2018 |

* cited by examiner

*Primary Examiner* — Sherman Ng
(74) *Attorney, Agent, or Firm* — Seed IP Law Group LLP

(57) ABSTRACT

Provided is a display device. The display device includes a stretchable display device. The stretchable display device includes a lower substrate including a display area and a non-display area. The stretchable display device further includes a plurality of lower connection lines on the lower substrate. The stretchable display device further includes a plurality of first substrates disposed on the display area, the plurality of first substrates defines sub pixels, and a modulus of the plurality of first substrates is larger than a modulus of the lower substrate. The stretchable display device further includes a plurality of connection substrates connecting adjacent first substrates among the plurality of first substrates. The stretchable display device further includes a plurality of upper connection lines disposed on the plurality of connection substrates. Therefore, various connection lines are configured in a limited space to improve an image quality of a stretchable display device.

19 Claims, 10 Drawing Sheets

STRETCHABLE DISPLAY DEVICE

CROSS-REFERENCE TO RELATED APPLICATIONS

This application claims the priority of Korean Patent Application No. 10-2019-0090049 filed on Jul. 25, 2019, in the Korean Intellectual Property Office, the disclosure of which is incorporated herein by reference.

BACKGROUND

Technical Field

The present disclosure relates to a stretchable display device, and more particularly to a stretchable display device in which a space limitation of a connection line is improved.

Description of the Related Art

As display devices which are used for a monitor of a computer, a television, or a cellular phone, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Recently, a stretchable display device which is manufactured by forming a display unit and a wiring line on a flexible substrate such as plastic which is a flexible material so as to be stretched in a specific direction and changed in various forms is getting attention as a next generation display device.

BRIEF SUMMARY

The present disclosure provides a stretchable display device in which the space limitation of a connection line is improved.

The present disclosure provides a stretchable display device which improves an image quality by increasing the number of connection lines.

In addition, the present disclosure provides a stretchable display device which improves a reliability by reducing a resistance of a connection line.

Benefits of the present disclosure are not limited to the above-mentioned benefits, and other benefits, which are not mentioned above, can be clearly understood by those skilled in the art from the following descriptions.

According to an aspect of the present disclosure, there is provided a display device. The display device includes a stretchable display device. The stretchable display device includes a lower substrate including a display area and a non-display area. The stretchable display device further includes a plurality of lower connection lines on the lower substrate. The stretchable display device further includes a plurality of first substrates disposed on the display area, the plurality of first substrates defines sub pixels, and a modulus of the plurality of first substrates is larger than a modulus of the lower substrate. The stretchable display device further includes a plurality of connection substrates connecting adjacent first substrates among the plurality of first substrates. The stretchable display device further includes a plurality of upper connection lines disposed on the plurality of connection substrates.

According to another aspect of the present disclosure, there is provided a stretchable display device. The stretchable display device includes a flexible substrate including a display area and a non-display area. The stretchable display device further includes a plurality of rigid substrates disposed in the display area or the non-display area. The stretchable display device further includes a plurality of connection substrates connecting the plurality of rigid substrates between the plurality of rigid substrates. The stretchable display device further includes a plurality of lower connection lines disposed below the plurality of connection substrates. The stretchable display device further includes a plurality of upper connection lines disposed above the plurality of connection substrates so as to overlap the plurality of lower connection lines.

Other detailed matters of the embodiments are included in the detailed description and the drawings.

According to the present disclosure, various connection lines are configured in a limited space to improve an image quality of a stretchable display device.

According to the present disclosure, connection lines are disposed above and below the substrate to improve the restriction on the number of connection lines.

According to the present disclosure, the connection lines are formed to have a parallel connection structure so that a resistance characteristic is improved and a reliability of the stretchable display device is improved.

The effects according to the present disclosure are not limited to the contents above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
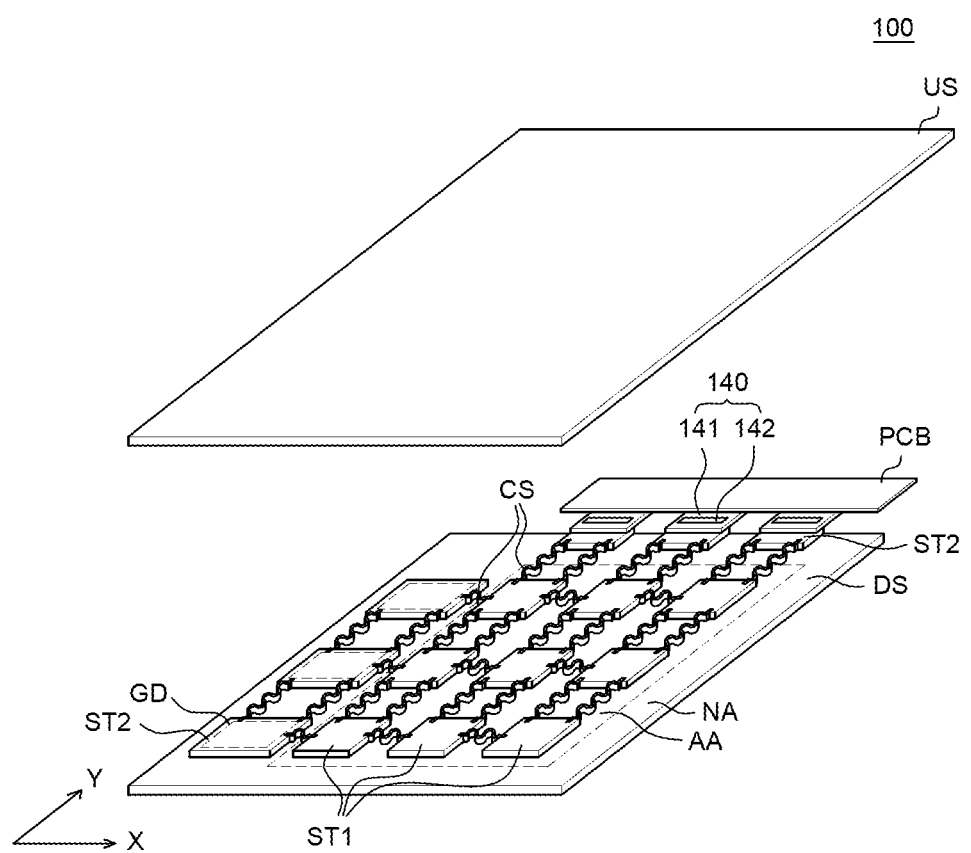
FIG. 1 is an exploded perspective view of a stretchable display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including" and "having," used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings.

Stretchable Display Device

A stretchable display device may be referred to as a display device which is capable of displaying images even though the display device is bent or stretched. The stretchable display device may have a high flexibility as compared with a general display device of the related art. Therefore, a shape of a stretchable display device may be freely changed in accordance with manipulation of a user to bent or stretch a stretchable display device. For example, when the user holds ends of the stretchable display device to pull the stretchable display device, the stretchable display device may be stretched by the force of the user. Alternatively, when the user disposes the stretchable display device on a wall surface which is not flat, the stretchable display device may be disposed to be bent in accordance with the shape of the surface of the wall. Alternatively, when a force applied by the user is removed, the stretchable display device may return to its original shape.

FIG. 1 is an exploded perspective view of a stretchable display device according to an embodiment of the present disclosure.

Referring to FIG. 1, a stretchable display device 100 includes a lower substrate DS, a plurality of first substrates ST1, a plurality of second substrates ST2, a plurality of connection substrates CS, a chip on film (COF) 140, a printed circuit board PCB, and an upper substrate US.

The lower substrate DS is a substrate which supports and protects several components of the stretchable display device 100. The lower substrate DS which is a soft substrate or a flexible substrate may be configured by an insulating material which is pliable, bendable or stretchable. For example, the lower substrate DS may be formed of a silicon rubber such as polydimethylsiloxane (PDMS) or an elastomer such as polyurethane (PU) or polytetrafluoroethylene (PTFE) and thus have a flexible property. However, the material of the lower substrate DS is not limited thereto.

The lower substrate DS is a flexible substrate so as to be reversibly expanded and contracted. Further, an elastic modulus of the upper substrate may be several MPa to several hundreds of MPa and an extension rupture rate may be 100% or higher. Here, the extension rupture rate refers to an extension rate at a timing when an object to be extended is broken or cracked. A thickness of the lower substrate DS may be 10 µm to 1 mm, but is not limited thereto.

The lower substrate DS may have a display area AA and a non-display area NA enclosing the display area AA.

The display area AA is an area in which an image is displayed in the stretchable display device 100 and a display element and various driving elements for driving the display element are disposed in the display area AA. The display area AA may include a plurality of pixels including a plurality of sub pixels. The plurality of pixels is disposed in the display area AA and includes a plurality of display elements. The plurality of sub pixels may be connected to various wiring lines, respectively. For example, the plurality of sub pixels may be connected to various wiring lines such as a gate line, a data line, an emission signal line, a high potential power line, a low potential power line, a reference voltage line, a compensation signal line.

The non-display area NA is adjacent to the display area AA. The non-display area NA is adjacent to the display area AA to enclose the display area AA. In the non-display area NA, no image is displayed and wiring lines and circuit units may be formed. For example, in the non-display area NA, a plurality of pads is disposed and the pads may be connected to the plurality of sub pixels of the display areas AA, respectively.

The plurality of first substrates ST1 and the plurality of second substrates ST2 are disposed on the lower substrate DS. The plurality of first substrates ST1 may be disposed in the display area AA of the lower substrate DS and the plurality of second substrates ST2 may be disposed in the non-display area NA of the lower substrate DS. Even though in FIG. 1, the plurality of second substrates ST2 is disposed at an upper side and a left side of the non-display area NA, it is not limited thereto and may be disposed in an arbitrary area of the non-display area NA.

The plurality of first substrates ST1 and the plurality of second substrates ST2 are substantially rigid substrates and are spaced apart from each other to be independently disposed on the lower substrate DS. A rigidity of the plurality of first substrates ST1 and the plurality of second substrates ST2 may be larger than a rigidity of the lower substrate DS. That is, the lower substrate DS may have flexible characteristics relatively more than the plurality of first substrates ST1 and the plurality of second substrates ST2, and the plurality of first substrates ST1 and the plurality of second substrates ST2 have substantially rigid characteristics more than the lower substrate DS.

The plurality of first substrates ST1 and the plurality of second substrates ST2 which are the plurality of rigid substrates may be formed of a plastic material having flexibility and for example, may be formed of polyimide (PI), polyacrylate, or polyacetate, but is not limited thereto. In this case, the plurality of first substrates ST1 and the plurality of second substrates ST2 may be formed of the same material, but are not limited thereto and may be formed of different materials.

Modulus of the plurality of first substrates ST1 and the plurality of second substrates ST2 may be higher than that of the lower substrate DS. In some embodiments, the modulus is an elastic modulus which represents a ratio being deformed by a stress with respect to a stress applied to the substrate. For instance, the modulus of elasticity may be the ratio between stress and strain. The higher the modulus, the higher a degree of hardness. Therefore, the plurality of first substrates ST1 and the plurality of second substrates ST2 may be a plurality of rigid substrates having larger rigidity as compared with the lower substrate DS. For example, the modulus of the plurality of first substrates ST1 and the plurality of second substrates ST2 may be 1000 times higher than the modulus of the lower substrate DS, but are not limited thereto. In other embodiments, other types of modulus may be considered. In some examples, the elastic moduli can be of three types, Young's modulus, Shear modulus, and Bulk modulus.

The COF 140 is a film on which various components are disposed on a base film 141 having a flexibility and supplies signals to the plurality of sub pixels of the display area AA. The COF 140 may be bond to the plurality of pads of the plurality of second substrates ST2 disposed in the non-display area NA and supplies a power voltage, a data voltage, or a gate voltage to the plurality of sub pixels of the display area AA through the pads. The COF 140 includes the base film 141 and a driving IC 142. Further, various components may be additionally disposed thereon.

The base film 141 is a layer which supports the driving IC 142 of the COF 140. The base film 141 may be formed of an insulating material, and for example, may be formed of an insulating material having a flexibility.

The driving IC 142 is a component which processes data for displaying images and a driving signal for processing the data. In FIG. 1, even though it is illustrated that the driving IC 142 is mounted by the COF 140 technique, it is not limited thereto and the driving IC 142 may be mounted by chip on glass (COG) or tape carrier package (TCP).

In FIG. 1, one second substrate ST2 is disposed in the non-display area NA at the upper side of the display area AA so as to correspond to one row of first substrates ST1 disposed in the display area and one COF 140 is disposed for one second substrate ST2, but is not limited thereto. That is, one second substrate ST2 and one COF 140 may be disposed so as to correspond to the first substrates ST1 in a plurality of rows.

A controller such as an IC chip or a circuit unit may be mounted on the printed circuit board PCB. Further, on the printed circuit board PCB, a memory or a processor may also be mounted. The printed circuit board PCB is a component which transmits a signal for driving the display element from the controller to the display element. Even though in FIG. 1, it is described that one printed circuit board PCB is used, the number of printed circuit boards PCB is not limited thereto.

Hereinafter, the stretchable display device 100 according to the embodiment of the present disclosure will be described in more detail with reference to FIGS. 2 and 3.

Planar and Cross-Sectional Structures

Figure 2:
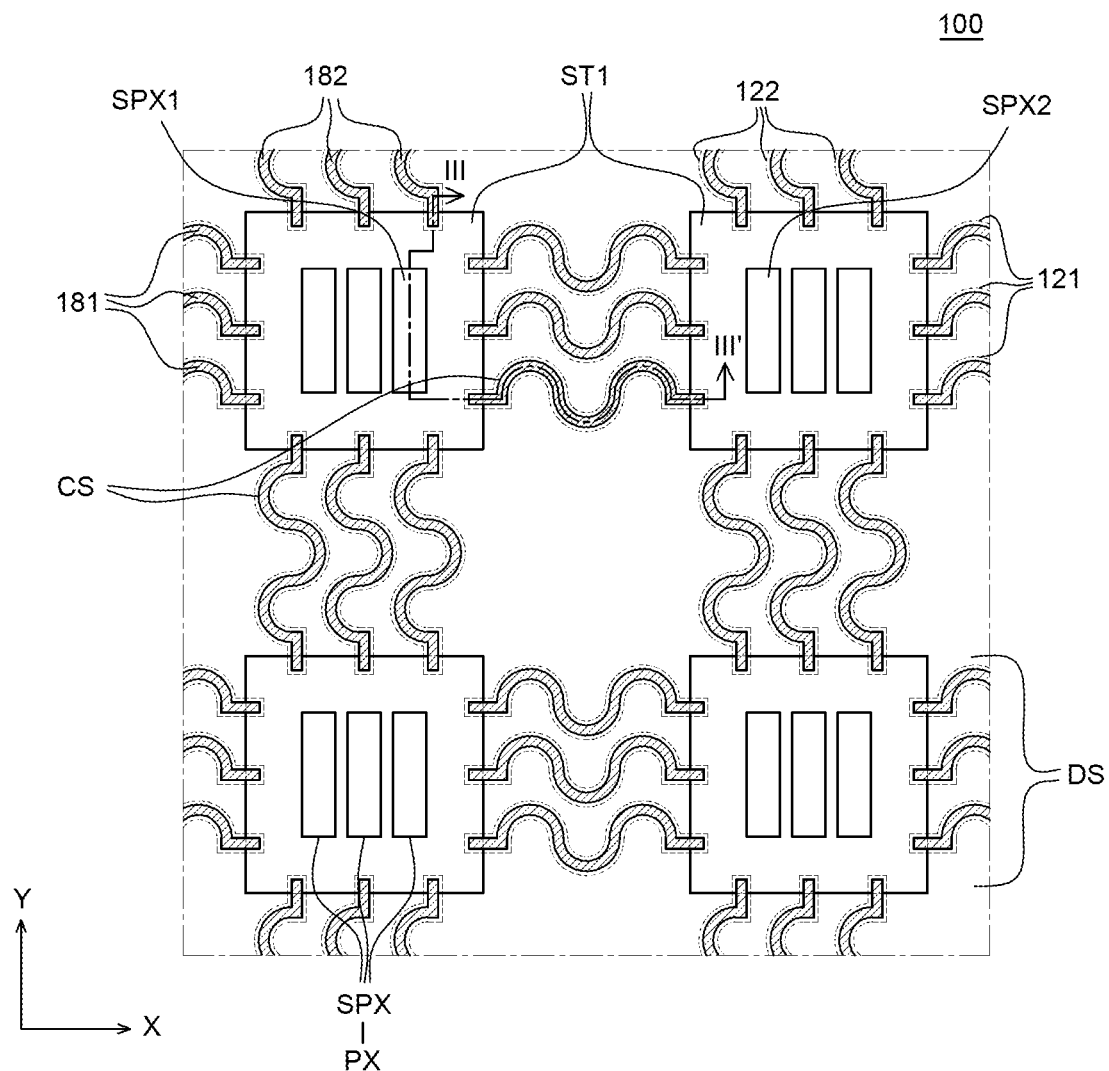
FIG. 2 is an enlarged plan view of a stretchable display device according to an embodiment of the present disclosure.

FIG. 2 is an enlarged plan view of a stretchable display device according to an embodiment of the present disclosure. FIG. 3 is a schematic cross-sectional view of one sub pixel taken along the line III-III' of FIG. 2. Even though in FIG. 2, for the convenience of description, it is illustrated that an area of a lower connection line 120 is larger than an area of an upper connection line 180, the present disclosure is not limited thereto. Substantially, the area of the lower connection line 120 and the area of the upper connection line 180 may be equal to each other. FIG. 3 may be a schematic cross-sectional view of an arbitrary first sub pixel SPX1 among the plurality of sub pixels SPX of FIG. 2 and an area adjacent to the arbitrary first sub pixel. For the convenience of description, the stretchable display device 100 according to the embodiment of the present disclosure will be described with reference to FIG. 1 together.

Figure 3:
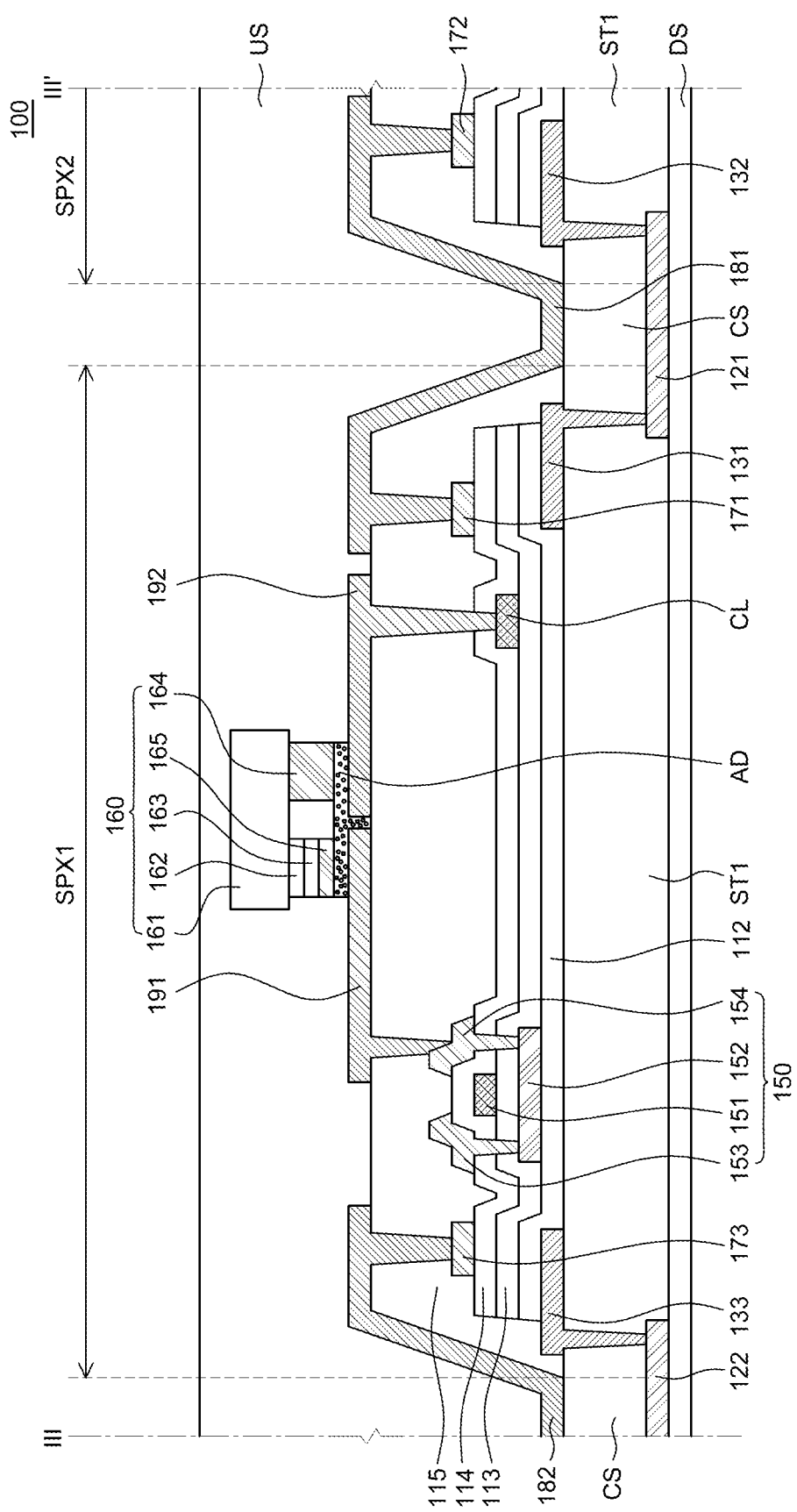
FIG. 3 is a schematic cross-sectional view of one sub pixel taken along the line III-III' of FIG. 2.

Referring to FIGS. 2 and 3, the stretchable display device 100 includes a lower substrate DS, a plurality of lower connection lines 120, a plurality of first substrates ST1, a plurality of connection substrates CS, a plurality of lower pads 130, a transistor 150, a plurality of upper pads 170, a plurality of upper connection lines 180, and an LED 160.

Referring to FIGS. 1 and 2, the plurality of first substrates ST1 is disposed on the lower substrate DS in the display area AA. The plurality of first substrates ST1 is spaced apart from each other to be disposed on the lower substrate DS. For example, as illustrated in FIGS. 1 and 2, the plurality of first substrates ST1 may be disposed on the lower substrate DS in a matrix, but is not limited thereto.

Referring to FIGS. 1 and 2, a plurality of sub pixels SPX which configures the plurality of pixels PX is disposed on the plurality of first substrates ST1 and a gate driver GD may be mounted on a second substrate ST2 located at a left side of the display area AA, among the plurality of second substrates ST2. The gate driver GD may be formed on the second substrate ST2 in a gate in panel (GIP) manner when various elements on the first substrate ST1 are manufactured. Therefore, various circuit configurations which configure the gate driver GD, such as various transistors, capacitors, and wiring lines may be disposed on the plurality of second substrates ST2. However, the gate driver GD is not limited thereto and may be mounted in a chip on film (COF) manner. Further, the plurality of second substrates ST2 is also disposed in the non-display area NA located at a right side of the display area AA and the gate driver GD may be mounted also in the plurality of second substrates ST2 located at the right side of the display area AA.

Referring to FIG. 1, a size of the plurality of second substrates ST2 may be larger than a size of the plurality of first substrates ST1. Specifically, a size of each of the plurality of second substrates ST2 may be larger than a size of each of the plurality of first substrates ST1. As described above, on each of the plurality of second substrates ST2, the gate driver GD is disposed. For example, one stage of the gate driver GD may be disposed on each of the plurality of second substrates ST2. Therefore, an area occupied by various circuit configurations which configure one stage of the gate driver GD may be relatively larger than an area of the first substrate ST1 on which the pixel PX is disposed. As a result, a size of each of the plurality of second substrates ST2 may be larger than a size of each of the plurality of first substrates ST1.

Referring to FIGS. 1 and 2, the plurality of connection substrates CS may be disposed between the plurality of first substrates ST1, between the plurality of second substrates ST2, or between the plurality of first substrates ST1 and the plurality of second substrates ST2. The plurality of connection substrates CS may be substrates which connect adjacent first substrates ST1, adjacent second substrates ST2, or the first substrate ST1 and the second substrate ST2 which are adjacent to each other. The plurality of connection substrates CS may be simultaneously and integrally formed with the same material as the plurality of first substrates ST1 or the plurality of second substrates ST2, but is not limited thereto.

Referring to FIG. 2, the plurality of connection substrates CS has a curved shape on a flat surface. For example, as illustrated in FIG. 2, the plurality of connection substrates CS may have a sine wave shape. However, the shape of the plurality of connection substrates CS is not limited thereto and the plurality of connection substrates CS may extend with a zigzag pattern or may be formed with various shapes such as a shape extended by connecting a plurality of rhombus-shaped substrates at vertexes. Further, the number and the shape of the plurality of connection substrates CS illustrated in FIG. 2 are illustrative and the number and the shape of the plurality of connection substrates CS may vary depending on the design.

Referring to FIG. 3, a buffer layer 112 is disposed on the plurality of first substrates ST1. The buffer layer 112 may be disposed so as to cover some of the plurality of pads 130. The buffer layer 112 is formed on the plurality of first substrates ST1 to protect various components of the stretchable display device 100 from permeation of moisture $H_2O$ and oxygen $O_2$ from the outside of the lower substrate DS and the plurality of first substrates ST1. The buffer layer 112 may be configured of an insulating material and for example, configured by a single layer or a double layer of an inorganic layer formed of silicon nitride (SiNx), silicon oxide (SiOx), and silicon oxynitride (SiON). However, the buffer layer 112 may be omitted depending on a structure or a characteristic of the stretchable display device 100.

The buffer layer 112 may be formed only in an area overlapping the plurality of first substrates ST1 and the plurality of second substrates ST2. As described above, the buffer layer 112 may be formed of an inorganic material so that the buffer layer 112 may be easily cracked or damaged during a process of stretching the stretchable display device 100. In this case, the buffer layer 112 is not formed in an area between the plurality of first substrates ST1 and the plurality of second substrates ST2, but is patterned to have a shape of the plurality of first substrates ST1 and the plurality of second substrates ST2 to be disposed only above the plurality of first substrates ST1 and the plurality of second substrates ST2. In other words, the buffer layer 112 may not be formed on the plurality of connection substrates CS. Therefore, in the stretchable display device 100 according to the embodiment of the present disclosure, the buffer layer 112 is formed only in an area overlapping the plurality of first substrates ST1 and the plurality of second substrates ST2 which are rigid substrates. Therefore, even though the stretchable display device 100 is bent or stretched to be deformed, the damage of the buffer layer 112 may be suppressed.

Referring to FIG. 3, the transistor 150 including a gate electrode 151, an active layer 152, a source electrode 153, and a drain electrode 154 is formed on the buffer layer 112.

First, referring to FIG. 3, the active layer 152 is disposed on the buffer layer 112. For example, the active layer 152 may be formed of an oxide semiconductor or amorphous silicon (a-Si), polycrystalline silicon (poly-Si), or an organic semiconductor.

A gate insulating layer 113 is disposed on the active layer 152. The gate insulating layer 113 is a layer for electrically insulating the gate electrode 151 from the active layer 152 and may be formed of an insulating material. For example, the gate insulating layer 113 may be formed as a single layer of silicon nitride (SiNx) or silicon oxide (SiOx) which is an inorganic material or a multi-layer of silicon nitride (SiNx) or silicon oxide (SiOx), but it is not limited thereto.

The gate electrode 151 is disposed on the gate insulating layer 113. The gate electrode 151 is disposed to overlap the active layer 152. The gate electrode 151 may be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

An interlayer insulating layer 114 is disposed on the gate electrode 151. The interlayer insulating layer 114 is a layer which insulates the gate electrode 151 from the source electrode 153 and the drain electrode 154 and is formed of an inorganic material, similarly to the buffer layer 112. For example, the interlayer insulating layer 114 may be formed as a single layer of silicon nitride (SiNx) or silicon oxide (SiOx) which is an inorganic material or a multi-layer of silicon nitride (SiNx) or silicon oxide (SiOx), but it is not limited thereto.

The source electrode 153 and the drain electrode 154 which are in contact with the active layer 152 are disposed on the interlayer insulating layer 114. The source electrode 153 and the drain electrode 154 are disposed on the same layer to be spaced apart from each other. The source electrode 153 and the drain electrode 154 may be in contact with the active layer 152 to be electrically connected to the active layer 152. The source electrode 153 and the drain electrode 154 may be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

Further, the gate insulating layer 113 and the interlayer insulating layer 114 are patterned to be formed only in an area overlapping the plurality of first substrates ST1. The gate insulating layer 113 and the interlayer insulating layer 114 are also formed of the inorganic material, similarly to the buffer layer 112, so that the gate insulating layer 113 and the interlayer insulating layer 114 may also be easily cracked to be damaged during the process of stretching the stretchable display device 100. Therefore, the gate insulating layer 113 and the interlayer insulating layer 114 are not formed in an area between the plurality of first substrates ST1, but are patterned to have a shape of the plurality of first substrates ST1 to be formed only above the plurality of first substrates ST1.

In FIG. 3, even though among various transistors which may be included in the stretchable display device 100, only a driving transistor is illustrated for the convenience of description, a switching transistor or a capacitor may also be included in the display device. Further, in the specification, even though it is described that the transistor 150 has a coplanar structure, various transistors such as a staggered transistor may also be used.

Referring to FIG. 3, a plurality of upper pads 170 is disposed on the interlayer insulating layer 114. In the drawing, even though it is illustrated that the plurality of upper pads 170 is disposed on the first substrates ST1, the plurality of upper pads 170 may also be disposed on the second substrates ST2. The plurality of upper pads 170 may be pads which transmit any one of various signals such as a gate signal, a data signal, an emission signal, a high potential power signal, a low potential power signal, a reference voltage signal, and a compensation signal to the plurality of sub pixels SPX, but is not limited thereto. The plurality of upper pads 170 may be configured to transmit signals which are different from that of the plurality of lower pads 130 to the plurality of sub pixels SPX. That is, the signal transmitted by the plurality of upper pads 170 and the signal transmitted by the plurality of lower pads 130 may be different from each other. The plurality of upper pads 170 may be formed of the same material as the source electrode 153 and the drain electrode 154, but is not limited thereto.

The plurality of upper pads 170 includes a first upper pad 171, a second upper pad 172, and a third upper pad 173. For example, the first upper pad 171 and the third upper pad 173 may be disposed in a first sub pixel SPX1 among the plurality of sub pixels SPX. The second upper pad 172 may be disposed in a second sub pixel SPX2 which is adjacent to the first sub pixel SPX1. In this case, the second upper pad 172 may be disposed in an area of the second sub pixel SPX2 which is adjacent to the first upper pad 171. The first upper pad 171 and the second upper pad 172 may be connected to one end and the other end of a first upper connection line 181, respectively. Further, the third upper pad 173 and an upper pad of another sub pixel SPX which is adjacent to the third upper pad 173 may be connected to one end and the other end of a second upper connection line 182, respectively.

Referring to FIG. 3, a planarization layer 115 is formed on the transistor 150 and the interlayer insulating layer 114. The planarization layer 115 planarizes an upper portion of the transistor 150. The planarization layer 115 may be configured by a single layer or a plurality of layers and may be formed of an organic material. Therefore, the planarization layer 115 may also be referred to as an organic insulating layer. For example, the planarization layer 115 may be formed of an acrylic-based organic material, but is not limited thereto.

Referring to FIG. 3, the planarization layer 115 is disposed on the plurality of first substrates ST1 to cover top surfaces and side surfaces of the buffer layer 112, the gate insulating layer 113, and the interlayer insulating layer 114 to enclose the buffer layer 112, the gate insulating layer 113, and the interlayer insulating layer 114 together with the plurality of first substrates ST1. Specifically, the planarization layer 115 may be disposed so as to cover a top surface and a side surface of the interlayer insulating layer 114, a side surface of the gate insulating layer 113, a side surface of the buffer layer 112, and a part of a top surface of the plurality of first substrates ST1.

The planarization layer 115 may supplement a step on the side surfaces of the buffer layer 112, the gate insulating layer 113, and the interlayer insulating layer 114 and enhance an adhesive strength of the planarization layer 115 and the connection line 180 disposed on the side surface of the planarization layer 115. For example, the side surface of the planarization layer 115 may have a slope which is gentler than a slope formed by a side surface of the interlayer insulating layer 114, a side surface of the gate insulating layer 113, and a side surface of the buffer layer 112. Therefore, the connection line 180 which is disposed to be in contact with the side surface of the planarization layer 115 is disposed with a gentle slope so that when the stretchable display device 100 is stretched, a stress generated in the connection line 180 is reduced. Further, the crack occurring in the connection line 180 or a separation from the side surface of the planarization layer 115 may be suppressed.

In some embodiments, a passivation layer may be formed between the transistor 150 and the planarization layer 115. That is, the passivation layer may be formed to cover the transistor 150 to protect the transistor 150 from the permeation of the moisture and oxygen. The passivation layer may be formed of an inorganic material and configured by a single layer or a plurality of layers, but is not limited thereto.

Referring to FIG. 3, a common line CL is disposed on the gate insulating layer 113. The common line CL is a wiring line which applies a common voltage to the plurality of sub pixels SPX. The common line CL may be formed of the same material as the gate electrode 151 of the transistor 150, but is not limited thereto.

Referring to FIG. 3, the first connection pad 191 and the second connection pad 192 are disposed on the planarization layer 115. The first connection pad 191 is an electrode which electrically connects an LED 160 to be described below and the transistor 150. For example, the first connection pad 191 may electrically connect the drain electrode 154 of the transistor 150 and the LED 160 through a contact hole formed in the planarization layer 115.

The second connection pad 192 is an electrode which electrically connects the LED 160 and the common line CL. For example, the second connection pad 192 may electrically connect the common electrode CL and the LED 160 through the contact hole formed in the planarization layer 115.

Referring to FIG. 3, the LED 160 is disposed on the first connection pad 191 and the second connection pad 192. The LED 160 includes an n-type layer 161, an active layer 162, a p-type layer 163, an n electrode 164, and a p electrode 165. The LED 160 of the stretchable display device 100 according to the embodiment of the present disclosure has a flip-chip structure in which the n electrode 164 and the p electrode 165 are formed on one surface.

The n-type layer 161 may be formed by injecting an n-type impurity into gallium nitride (GaN). The n-type layer 161 may be disposed on a separate base substrate which is formed of a material which is capable of emitting light.

The active layer 162 is disposed on the n-type layer 161. The active layer 162 is a light emitting layer which emits light in the LED 160 and may be formed of a nitride semiconductor, for example, indium gallium nitride (InGaN). The p-type layer 163 is disposed on the active layer 162. The p-type layer 163 may be formed by injecting a p-type impurity into gallium nitride (GaN).

As described above, the LED 160 according to the embodiment of the present disclosure may be manufactured by sequentially laminating the n-type layer 161, the active layer 162, and the p-type layer 163, and then etching a predetermined part to form the n electrode 164 and the p electrode 165. In this case, the predetermined part is a space for separating the n electrode 164 and the p electrode 165 from each other and the predetermined part may be etched to expose a part of the n-type layer 161. In other words, the surfaces of the LED 160 to dispose the n electrode 164 and the p electrode 165 are not flat surfaces, but have different heights.

As described above, in the etched area, in other words, on the n-type layer 161 exposed by the etching process, the n electrode 164 is disposed. The n electrode 164 may be formed of a conductive material. In the meantime, in an area which is not etched, in other words, on the p-type layer 163, the p electrode 165 is disposed. The p electrode 165 is also formed of a conductive material, for example, may be formed of the same material as the n electrode 164.

An adhesive layer AD is disposed on top surfaces of the first connection pad 191 and the second connection pad 192 and between the first connection pad 191 and the second connection pad 192 so that the LED 160 may be bonded onto the first connection pad 191 and the second connection pad 192. In this case, the n electrode 164 may be disposed on the second connection pad 192 and the p electrode 165 may be disposed on the first connection pad 191.

The adhesive layer AD may be a conductive adhesive layer in which conductive balls are dispersed in an insulating base member. Therefore, when heat or pressure is applied to the adhesive layer AD, the conductive balls are electrically connected in a portion applied with heat or pressure to have a conductive property and an area which is not pressurized may have an insulating property. For example, the n electrode 164 is electrically connected to the second upper connection line 182 by means of the adhesive layer AD and the p electrode 165 is electrically connected to the first connection line 181 by means of the adhesive layer AD. That is, after applying the adhesive layer AD on the first connection pad 191 and the second connection pad 192 using an inkjet method, the LED 160 is transferred onto the adhesive layer AD and the LED 160 is pressurized and heated. By doing this, the first connection pad 191 is electrically connected to the p electrode 165 and the second connection pad 192 is electrically connected to the n electrode 164. However, another part of the adhesive layer AD excluding a part of the adhesive layer AD disposed between the n electrode 164 and the second connection pad 192 and a part of the adhesive layer AD disposed between the p electrode 165 and the first connection pad 191 has an insulating property. In the meantime, the adhesive layer AD may be divided to be disposed on the first connection pad 191 and the second connection pad 192, respectively.

As described above, the stretchable display device 100 according to the embodiment of the present disclosure has a structure in which the LED 160 is disposed on the lower substrate DS on which the transistor 150 is disposed. Therefore, when the stretchable display device 100 is turned on, different voltage levels which are applied to the first connection pad 191 and the second connection pad 192 are transmitted to the n electrode 164 and the p electrode 165 so that the LED 160 emits light.

In the meantime, even though in FIG. 3, it is illustrated that a bank is not used, the bank may be formed on the first connection pad 191, the second connection pad 192, the connection line 180, and the planarization layer 115. The bank may divide sub pixels SPX which are disposed on one side and the other side of the LED 160 to be adjacent to each other. The bank may be formed of an insulating material. Further, the bank may include a black material. The bank includes the black material to block wiring lines which may be visible through the display area AA. For example, the bank may be formed of a transparent carbon-based mixture and specifically, include carbon black. However, it is not limited thereto and the bank may be formed of a transparent insulating material.

Referring to FIGS. 1 and 3, the upper substrate US is disposed on the LED 160 and the lower substrate DS. The upper substrate US is a substrate which supports various components disposed below the upper substrate US. Specifically, the upper substrate US is formed by coating a material which configures the upper substrate US on the lower substrate DS and then curing the material to be disposed to be in contact with the lower substrate DS, the first substrate ST1, the second substrate ST2, and the connection substrate CS.

The upper substrate US which is a flexible substrate may be configured by an insulating material which is bendable or stretchable. The upper substrate US is a flexible substrate so as to be reversibly expanded and contracted. Further, an elastic modulus of the upper substrate may be several MPa to several hundreds of MPa and an extension rupture rate may be 100% or higher. A thickness of the upper substrate US may be 10 μm to 1 mm, but is not limited thereto.

The upper substrate US may be formed of the same material as the lower substrate DS. For example, the upper substrate US may be formed of a silicon rubber such as polydimethylsiloxane (PDMS) or an elastomer such as polyurethane (PU) or polytetrafluoroethylene (PTFE) and thus have a flexible property. However, the material of the upper substrate US is not limited thereto.

In the meantime, even though not illustrated in FIG. 3, a polarization layer may be disposed on the upper substrate US. The polarization layer may perform a function which polarizes light incident from the outside of the stretchable display device 100 to reduce the external light reflection. Further, an optical film other than the polarization layer may be disposed on the upper substrate US.

Referring to FIGS. 2 and 3, the plurality of lower connection lines 120 and the plurality of upper connection lines 180 may be disposed below and above the plurality of connection substrates CS, respectively. The plurality of connection substrates CS, the plurality of lower connection lines 120, and the plurality of upper connection lines 180 which overlap each other may be formed to have the same shape. In this case, the plurality of lower connection lines 120 and the plurality of upper connection lines 180 may transmit different electrical signals. In the meantime, the thickness of the plurality of connection substrates CS may be 6 μm to 8 μm. Therefore, even though the plurality of lower connection lines 120 and the plurality of upper connection lines 180 disposed below and above the plurality of connection substrates CS, respectively, transmit different electrical signals, the interference between the plurality of lower connection lines 120 and the plurality of upper connection lines 180 may be reduced or minimized.

Referring to FIGS. 2 and 3, the plurality of lower connection lines 120 is disposed on the lower substrate DS. The plurality of lower connection lines 120 may refer to wiring lines which electrically connect the plurality of lower pads 130 which is adjacent to each other. The plurality of lower connection lines 120 may be configured by one of various wiring lines such as a gate line, a data line, an emission signal line, a high potential power line, a low potential power line, a reference voltage line, and a compensation signal line, but is not limited thereto.

The plurality of lower connection lines 120 is disposed between two adjacent first substrates ST1 to electrically connect the two adjacent first substrates ST1. Further, the plurality of lower connection lines 120 may be disposed between adjacent two second substrates ST2 and between the first substrate ST1 and the second substrate ST2 which are adjacent to each other.

The plurality of lower connection lines 120 may be disposed between the lower substrate DS and the plurality of first substrates ST1 and between the lower substrate DS and the plurality of connection substrates CS. Further, the plurality of lower connection lines 120 may also be disposed between the lower substrate DS and the plurality of second substrates ST2. The plurality of lower connection lines 120 may be disposed with the same shape as the upper connection line 180 to overlap the upper connection line 180. Specifically, in an area corresponding to the connection substrates CS, the plurality of lower connection lines 120, the plurality of connection substrates CS, and the plurality of upper connection lines 180 are formed to have the same shape to overlap each other. That is, the plurality of lower connection lines 120 may have the same curved shape as the plurality of connection substrates CS below the plurality of connection substrates CS.

The plurality of lower connection lines 120 includes a first lower connection line 121 and a second lower connection line 122. The first lower connection line 121 and the second lower connection line 122 may be disposed between the plurality of first substrates ST1, between the plurality of second substrates ST2, or between the plurality of first substrates ST1 and the plurality of second substrates ST2. For example, the first lower connection line 121 may be disposed between the first sub pixel SPX1 and the second sub pixel SPX2. Further, the second lower connection line 122 may be disposed between the first sub pixel SPX1 and another sub pixel SPX adjacent to the first sub pixel SPX1.

In FIGS. 1 and 2, the first lower connection line 121 refers to a wiring line extending in an X axis direction among the plurality of lower connection lines 120 and the second lower connection line 122 refers to a wiring line extending in a Y axis direction among the plurality of lower connection lines 120. The first lower connection line 121 and the second lower connection line 122 may be configured to transmit different signals to the plurality of sub pixels SPX. That is, a signal transmitted by the first lower connection line 121 may be different from a signal transmitted by the second lower connection line 122.

The plurality of lower connection lines 120 may be formed of a metal material such as copper (Cu), aluminum (Al), titanium (Ti), and molybdenum or a stacked structure of metal materials such as copper/molybdenum-titanium (Cu/Moti) or titanium/aluminum/titanium (Ti/Al/Ti), but is not limited thereto.

Referring to FIG. 3, a plurality of lower pads 130 is disposed on the plurality of first substrates ST1. Further, the plurality of lower pads 130 may also be disposed on the plurality of second substrates ST2. The plurality of lower pads 130 may be pads which transmit any one of various signals such as a gate signal, a data signal, an emission signal, a high potential power signal, a low potential power signal, a reference voltage signal, and a compensation signal to the plurality of sub pixels SPX, but is not limited thereto.

The plurality of lower pads 130 includes a first lower pad 131, a second lower pad 132, and a third lower pad 133. For example, the first lower pad 131 and the third lower pad 133 may be disposed in the first sub pixel SPX1 among the plurality of sub pixels SPX. The second lower pad 132 may be disposed in a second sub pixel SPX2 which is adjacent to the first sub pixel SPX1. In this case, the second lower pad 132 may be disposed in an area of the second sub pixel SPX2 which is adjacent to the first lower pad 131. The first lower pad 131 and the second lower pad 132 may be connected to one end and the other end of the first lower connection line 121. Further, the third lower pad 133 and a lower pad of another sub pixel SPX which is adjacent to the third lower pad 133 may be connected to one end and the other end of the second lower connection line 122, respectively. In this case, the lower pad 130 and the lower connection line 120 may be connected to each other through contact holes formed in the first substrate ST1.

The lower pad 130 may be any one of various metal materials, such as molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

Referring to FIGS. 2 and 3, the plurality of upper connection lines 180 is disposed on the planarization layer 115 and the plurality of connection substrates CS. The plurality of upper connection lines 180 may refer to wiring lines which electrically connect the plurality of upper pads 170 which is adjacent to each other. In this case, the upper connection line 180 and the upper pad 170 may be connected to each other through a contact hole formed in the planarization layer 115. The plurality of upper connection lines 180 may be configured by one of various wiring lines such as a gate line, a data line, an emission signal line, a high potential power line, a low potential power line, a reference voltage line, and a compensation signal line, but is not limited thereto.

The plurality of upper connection lines 180 is disposed between two adjacent first substrates ST1 to electrically connect two first substrates ST1. Specifically, the plurality of upper connection lines 180 is disposed on the connection substrate CS which connects two adjacent first substrates ST1 and two adjacent second substrates ST2. Further, the plurality of upper connection lines 180 may be disposed between adjacent two second substrates ST2 and between the first substrate ST1 and the second substrate ST2 which are adjacent to each other.

In an area corresponding to the connection substrates CS, the plurality of upper connection lines 180 is formed to have the same shape as the plurality of connection substrates CS and the plurality of lower connection lines 120 to overlap each other. That is, the plurality of upper connection lines 180 may have the same curved shape as the plurality of connection substrates CS above the plurality of connection substrates CS. In this case, the plurality of upper connection lines 180 may be configured to transmit a signal which is different from that of the plurality of lower connection lines 120 to the plurality of sub pixels SPX. That is, a signal transmitted by the plurality of upper connection lines 180 may be different from a signal transmitted by the plurality of lower connection lines 120.

The plurality of upper connection lines 180 includes the first upper connection line 181 and the second upper connection line 182. The first upper connection line 181 and the second upper connection line 182 may be disposed between the plurality of first substrates ST1, between the plurality of second substrates ST2, or between the plurality of first substrates ST1 and the plurality of second substrates ST2. For example, the first upper connection line 181 may be disposed between the first sub pixel SPX1 and the second sub pixel SPX2. Further, the second upper connection line 182 may be disposed between the first sub pixel SPX1 and another sub pixel SPX adjacent to the first sub pixel SPX1.

The first upper connection line 181 is formed to extend to a top surface of the connection substrate CS while being in contact with a top surface and a side surface of the planarization layer 115 disposed on the first substrate ST1. Further, the second upper connection line 182 is formed to extend to the top surface of the connection substrate CS while being in contact with a top surface and a side surface of the planarization layer 115 disposed on the first substrate ST1.

In FIGS. 1 and 2, the first upper connection line 181 refers to a wiring line extending in an X axis direction among the plurality of upper connection line 180 and the second upper connection line 182 refers to a wiring line extending in a Y axis direction among the plurality of upper connection line 180. The first upper connection line 181 and the second upper connection line 182 may be configured to transmit different signals to the plurality of sub pixels SPX. That is, a signal transmitted by the first upper connection line 181 may be different from a signal transmitted by the second upper connection line 182.

The plurality of upper connection lines 180 may be formed of a metal material such as copper (Cu), aluminum (Al), titanium (Ti), and molybdenum or a stacked structure of metal materials such as copper/molybdenum-titanium (Cu/Moti) or titanium/aluminum/titanium (Ti/Al/Ti), but is not limited thereto.

The display device includes various signal lines such as a gate line, a data line, an emission signal line, a high potential power line, a low potential power line, a reference voltage line, or a compensation signal line. In the case of a general display device, various signal lines extend as a straight line between the plurality of sub pixels and the plurality of sub pixels is connected to one signal line. Therefore, in the general display device, various signal lines may extend from one side of the display device to the other side without being disconnected on the substrate.

In contrast, in the case of the stretchable display device 100 according to the embodiment of the present disclosure, a straight signal line which is considered to be used for the general display device is disposed only on the plurality of first substrates ST1 and the plurality of second substrates ST2. That is, in the stretchable display device 100 according to the embodiment of the present disclosure, a straight signal line may be disposed only on the plurality of first substrates ST1 and the plurality of second substrates ST2.

In the stretchable display device 100 according to the embodiment of the present disclosure, in order to connect discontinuous wiring lines on the first substrate ST1 or the second substrate ST2, the lower pad 130 and the upper pad 170 on the adjacent substrates ST1 and ST2 may be connected by the lower connection line 120 and the upper connection line 180. That is, the lower connection line 120 and the upper connection line 180 electrically connect adjacent two first substrates ST1 and two second substrates ST2 and the lower pad 130 and the upper pad 170 on the first substrate ST1 and the second substrate ST2. Therefore, in the stretchable display device 100 according to the embodiment of the present disclosure, straight signal lines on the plurality of first substrates ST1 and the plurality of second substrates ST2 may be electrically connected to each other by the plurality of lower connection lines 120 and the plurality of upper connection lines 180.

For example, the gate line may be disposed on the plurality of first substrates ST1 disposed to be adjacent to each other in the X axis direction and the gate pad may be disposed on both ends of the gate line. For example, the first upper pad 171 may be one of gate pads disposed on both ends of the gate line of the first sub pixel SPX1. The second upper pad 172 may be one of gate pads disposed on both ends of the gate line of the second sub pixel SPX2. The first upper connection line 181 may serve as a gate line. Further, the first upper pad 171 and the second upper pad 172 on the plurality of first substrates ST1 which are adjacent to each other in the X axis direction may be connected to each other by the first upper connection line 181 on the connection substrate CS. Therefore, the gate line disposed on the plurality of first substrates ST1 and the first upper connection line 181 disposed on the connection substrate CS may serve as one gate line. Accordingly, one gate signal may be transmitted to the gate electrode 151 of the plurality of sub pixels SPX through the first upper pad 171, the second upper pad 172, the first upper connection line 181, and the gate lines disposed on the plurality of first substrates ST1.

Further, the data line is disposed on the plurality of first substrates ST1 disposed to be adjacent to each other in the Y axis direction and a data pad may be disposed on both ends of the data line. For example, the third upper pad 173 may be one of data pads disposed on both ends of the data line of the first sub pixel SPX1. The second upper connection line 182 may serve as a data line. The third upper pad 173 on the plurality of first substrates ST1 which are adjacent to each other in the Y axis direction and another upper pad may be connected to each other by the second upper connection line 182 on the connection substrate CS. Therefore, the data line disposed on the plurality of first substrates ST1 and the second upper connection line 182 disposed on the connection substrate CS may serve as one data line. Accordingly, one data signal may be transmitted to the plurality of sub pixels SPX through the third upper pad 173, another upper pad, the second upper connection line 182, and the data lines disposed on the plurality of first substrates ST1.

That is, the upper pad 170 or the lower pad 130 may be disposed on both ends of a specific signal line disposed in the plurality of sub pixels SPX. Two upper pads 170 or two lower pads 130 between two adjacent sub pixels SPX may be connected to each other by the upper connection line 180 or the lower connection line 120. That is, the signal lines disposed in the plurality of sub pixels SPX may serve as one signal line by the upper pad 170 and the upper connection line 180 or the lower pad 130 and the lower connection line 120. Therefore, all various wiring lines extending in the X axis direction or the Y axis direction which may be included in the stretchable display device 100, such as a gate line, a data line, an emission signal line, a high potential power line, a low potential power line, a reference voltage line, or a compensation signal line, may be electrically connected by the upper connection line 180 and the lower connection line 120.

Referring to FIG. 1, the upper connection line 180 and the lower connection line 120 may further include a wiring line which connects pads on the plurality of first substrates ST1 and the plurality of second substrates ST2 to each other or connects pads on two second substrates ST2 which are disposed to be parallel among pads on the plurality of second substrates ST2 adjacent in the Y axis direction.

The stretchable display device may form the connection substrate CS and the connection line which connect between the plurality of adjacent first substrates ST1, between the plurality of second substrates ST2, or between the first substrate ST1 and the second substrate ST2 with a curved shape so that the shape may be freely changed. That is, the plurality of pixels PX which is spaced apart from each other may be connected by the connection line with a curved shape. However, the connection line has a curved shape so that an area occupied by one connection line in the stretchable display device may be increased. Therefore, a space of the connection line which can be formed in the stretchable display device may be limited. Further, the number of connection lines which can be formed in the stretchable display device is limited so that the number of connection lines is limited. Accordingly, it is not easy to add a connection line to supply an additional signal for improvement of an image quality so that it is difficult to improve the quality of the stretchable display device.

Therefore, in the stretchable display device 100 according to the embodiment of the present disclosure, connection lines may be disposed above and below the first substrate ST1, the second substrate ST2, and the connection substrate CS. That is, the lower connection line 120 is disposed below the connection substrate CS and the upper connection line 180 is disposed above the connection substrate CS. Therefore, various signal lines of two adjacent first substrates ST1, two second substrates ST2, and the first substrate ST1 and the second substrate ST2 which are connected by the connection substrate CS may be connected by the lower connection line 120 and the upper connection line 180. Therefore, the limited space of the connection line is improved so that more signal lines may be disposed in the stretchable display device 100.

Specifically, as the number of signal lines formed in the stretchable display device 100 is increased, an additional signal line such as a compensation signal line may be disposed. Therefore, a quality of the stretchable display device 100 may be improved by improving an image quality of the stretchable display device 100.

Further, in the stretchable display device 100 according to the embodiment of the present disclosure, the connection substrate CS is disposed on the lower connection line 120 and the upper connection line 180 may be disposed on the connection substrate CS. In this case, the lower connection line 120, the connection substrate CS, and the upper connection line 180 may be formed to have the same shape. Further, the lower connection line 120, the connection substrate CS, and the upper connection line 180 may overlap each other, for example, completely overlap. Therefore, when the stretchable display device 100 is stretched, a stress applied to the connection lines 120 and 180 may be reduced or minimized.

Specifically, when the connection lines 120 and 180 and the connection substrate CS do not overlap each other, if the stretchable display device 100 is stretched, an area to be stretched may be increased. For example, referring to FIG. 2, when the connection lines 120 and 180 and the connection substrate CS overlap each other, there may be three connection areas between two adjacent first substrates ST1. However, when the connection lines 120 and 180 and the connection substrate CS do not overlap each other, the number of connection areas between two adjacent first substrates ST1 may be larger than three. Therefore, when the connection lines 120 and 180 and the connection substrate CS do not overlap each other, a stress applied when the stretchable display device 100 is stretched may be increased. Therefore, the stretchable display device 100 is cracked due to an increased stress during a process of stretching the stretchable display device 100 with a desired extension rate so that the reliability may be lowered.

Therefore, in the stretchable display device 100 according to the embodiment of the present disclosure, the lower connection line 120, the connection substrate CS, and the upper connection line 180 may be formed to overlap with the same shape. Accordingly, when the stretchable display device 100 is stretched, the stress applied to the stretchable display device 100 is reduced or minimized to improve the durability of the stretchable display device 100.

Arrangement Relationship of Lower Pad and Inorganic Insulating Layer

Figure 4:
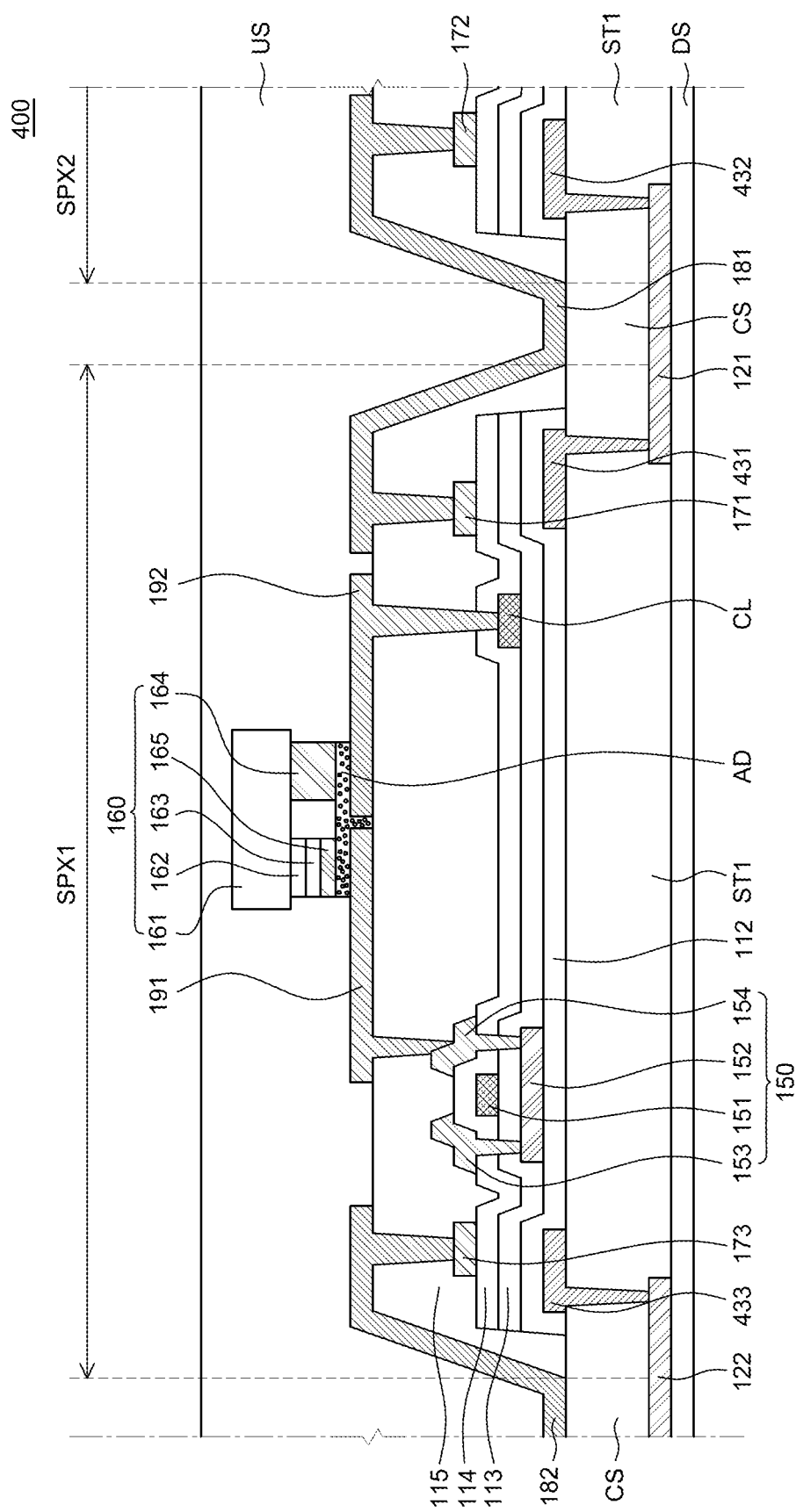
FIG. 4 is a schematic cross-sectional view of one sub pixel of a stretchable display device according to another embodiment of the present disclosure.

FIG. 4 is a schematic cross-sectional view of one sub pixel of a stretchable display device according to another embodiment of the present disclosure. A stretchable display device 400 illustrated in FIG. 4 is substantially the same as the stretchable display device 100 illustrated in FIGS. 1 to 3 except for a lower pad 430, so that a redundant description will be omitted.

The plurality of lower connection lines 120 is disposed on the lower substrate DS. The plurality of lower connection lines 120 refers to wiring lines which electrically connect a plurality of lower pads 430 which is adjacent to each other. The plurality of lower connection lines 120 may be configured by one of various wiring lines such as a gate line, a data line, an emission signal line, a high potential power line, a low potential power line, a reference voltage line, and a compensation signal line, but is not limited thereto.

The plurality of lower pads 430 is disposed on the plurality of first substrates ST1. Further, the plurality of lower pads 430 may also be disposed on the plurality of second substrates ST2. The plurality of lower pads 430 may be pads which transmit any one of various signals such as a gate signal, a data signal, an emission signal, a high potential power signal, a low potential power signal, a reference voltage signal, and a compensation signal to the plurality of sub pixels SPX, but is not limited thereto.

The plurality of lower pads 430 includes a first lower pad 431, a second lower pad 432, and a third lower pad 433. For example, the first lower pad 431 and the third lower pad 433 may be disposed in a first sub pixel SPX1 among the plurality of sub pixels SPX. The second lower pad 432 may be disposed in a second sub pixel SPX2 which is adjacent to the first sub pixel SPX1. In this case, the second lower pad 432 may be disposed in an area of the second sub pixel SPX2 which is adjacent to the first lower pad 431. The first lower pad 431 and the second lower pad 432 may be connected to one end and the other end of the first lower connection line 121. Further, the third lower pad 433 and a lower pad of another sub pixel SPX which is adjacent to the third lower pad 433 may be connected to one end and the other end of the second lower connection line 122, respectively. In this case, the lower pad 430 and the lower connection line 120 may be connected to each other through contact holes formed in the first substrate ST1.

The plurality of lower pads 430 is disposed in a buffer layer 112. The buffer layer 112 may be disposed so as to completely cover the plurality of lower pads 430. That is, the buffer layer 112 may be disposed to enclose both the top surface and the side surface of the plurality of lower pads 430. A gate insulating layer 113 and an interlayer insulating layer 114 are disposed on the buffer layer 112 and the planarization layer 115 may be disposed so as to cover the buffer layer 112, the gate insulating layer 113, and the interlayer insulating layer 114. Therefore, the plurality of lower pads 430 may be blocked from the external environment by the buffer layer 112 and the planarization layer 114.

In the stretchable display device 400 according to another embodiment of the present disclosure, the lower pad 430 may be disposed so as to be completely enclosed by the buffer layer 112. Accordingly, the plurality of lower pads 430 may be protected from foreign materials such as moisture and oxygen which may permeate from the outside. That is, the damage of the plurality of lower pads 430 may be suppressed and the reliability of the stretchable display device 400 may be improved.

Parallel Connection of Upper Connection Line and Lower Connection Line

Figure 5:
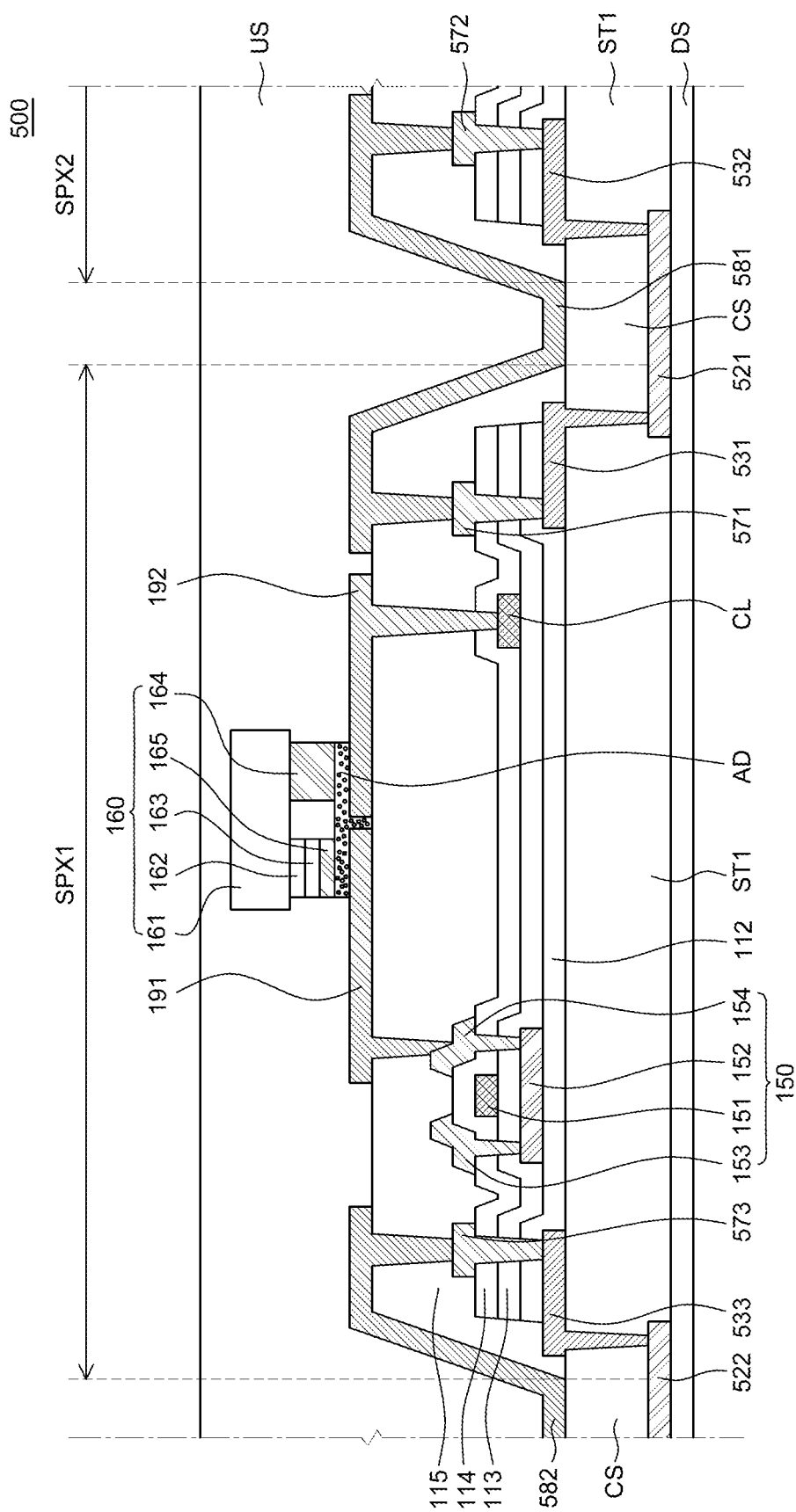
FIG. 5 is a schematic cross-sectional view of one sub pixel of a stretchable display device according to still another embodiment of the present disclosure.

FIG. 5 is a schematic cross-sectional view of one sub pixel of a stretchable display device according to still another embodiment of the present disclosure. A stretchable display device 500 illustrated in FIG. 5 is substantially the same as the stretchable display device 100 illustrated in FIGS. 1 to 3 except for a lower connection line 520, a lower pad 530, an upper pad 570, and an upper connection line 580 so that a redundant description will be omitted.

A plurality of lower connection lines 520 is disposed on the lower substrate DS. The plurality of lower connection lines 520 refers to wiring lines which electrically connect a plurality of lower pads 530 which is adjacent to each other. The plurality of lower connection lines 520 may be configured by one of various wiring lines such as a gate line, a data line, an emission signal line, a high potential power line, a low potential power line, a reference voltage line, and a compensation signal line, but is not limited thereto.

The plurality of lower connection lines 520 is disposed between two adjacent first substrates ST1 to electrically connect the two adjacent first substrates ST1. Further, the plurality of lower connection lines 520 may be disposed between adjacent two second substrates ST2 and between the first substrate ST1 and the second substrate ST2 which are adjacent to each other.

The plurality of lower connection lines 520 may be disposed between the lower substrate DS and the plurality of first substrates ST1 and between the lower substrate DS and the plurality of connection substrates CS. Further, the plurality of lower connection lines 520 may also be disposed between the lower substrate DS and the plurality of second substrates ST2. In an area corresponding to the connection substrates CS, the plurality of lower connection lines 520, the plurality of connection substrates CS, and a plurality of upper connection lines 580 are formed to have the same shape to overlap each other. That is, the plurality of lower connection lines 520 may have the same curved shape as the plurality of connection substrates CS below the plurality of connection substrates CS.

The plurality of lower connection lines 520 includes a first lower connection line 521 and a second lower connection line 522. The first lower connection line 521 and the second lower connection line 522 may be disposed between the plurality of first substrates ST1, between the plurality of second substrates ST2, or between the plurality of first substrates ST1 and the plurality of second substrates ST2. For example, the first lower connection line 521 may be disposed between the first sub pixel SPX1 and the second sub pixel SPX2. Further, the second lower connection line 522 may be disposed between the first sub pixel SPX1 and another sub pixel SPX adjacent to the first sub pixel SPX1.

The first lower connection line 521 refers to a wiring line extending in an X axis direction among the plurality of lower connection line 520 and the second lower connection line 522 refers to a wiring line extending in a Y axis direction among the plurality of lower connection line 520. The first lower connection line 521 and the second lower connection line 522 may be configured to transmit different signals to the plurality of sub pixels SPX. That is, a signal transmitted by the first lower connection line 521 may be different from a signal transmitted by the second lower connection line 522.

The plurality of lower pads 530 is disposed on the plurality of first substrates ST1. Further, the plurality of lower pads 530 may also be disposed on the plurality of second substrates ST2. The plurality of lower pads 530 may be pads which transmit any one of various signals such as a gate signal, a data signal, an emission signal, a high potential power signal, a low potential power signal, a reference voltage signal, and a compensation signal to the plurality of sub pixels SPX, but is not limited thereto.

The plurality of lower pads 530 includes a first lower pad 531, a second lower pad 532, and a third lower pad 533. For example, the first lower pad 531 and the third lower pad 533 may be disposed in the first sub pixel SPX1 among the plurality of sub pixels SPX. The second lower pad 532 may be disposed in a second sub pixel SPX2 which is adjacent to the first sub pixel SPX1. In this case, the second lower pad 532 may be disposed in an area of the second sub pixel SPX2 which is adjacent to the first lower pad 531. The first lower pad 531 and the second lower pad 532 may be connected to one end and the other end of the first lower connection line 521. Further, the third lower pad 533 and a lower pad of another sub pixel SPX which is adjacent to the third lower pad 533 may be connected to one end and the other end of the second lower connection line 522, respectively. In this case, the lower pad 530 and the lower connection line 520 may be connected to each other through contact holes formed in the first substrate ST1.

The plurality of upper pads 570 is disposed on an interlayer insulating layer 114. In the drawing, even though it is illustrated that the plurality of upper pads 570 is disposed on the first substrates ST1, the plurality of upper pads 570 may also be disposed on the second substrates ST2. The plurality of upper pads 570 may be pads which transmit any one of various signals such as a gate signal, a data signal, an emission signal, a high potential power signal, a low potential power signal, a reference voltage signal, and a compensation signal to the plurality of sub pixels SPX, but is not limited thereto.

The plurality of upper pads 570 includes a first upper pad 571, a second upper pad 572, and a third upper pad 573. For example, the first upper pad 571 and the third upper pad 573 may be disposed in a first sub pixel SPX1 among the plurality of sub pixels SPX. The second upper pad 572 may be disposed in a second sub pixel SPX2 which is adjacent to the first sub pixel SPX1. In this case, the second upper pad 572 may be disposed in an area of the second sub pixel SPX2 which is adjacent to the first upper pad 571. The first upper pad 571 and the second upper pad 572 may be connected to one end and the other end of the first upper connection line 581, respectively. Further, the third upper pad 573 and an upper pad of another sub pixel SPX which is adjacent to the third upper pad 573 may be connected to one end and the other end of the second upper connection line 582, respectively.

The plurality of upper pads 570 may be electrically connected to the plurality of lower pads 530. That is, the plurality of upper pads 570 may be electrically connected to the plurality of lower pads 530 disposed therebelow so as to correspond to the plurality of upper pads 570. For example, the first upper pad 571 is connected to the first lower pad 531, the second upper pad 572 is connected to the second lower pad 532, and the third upper pad 573 is connected to the third lower pad 533. The plurality of upper pads 570 and the plurality of lower pads 530 may be connected to each other through contact holes which pass through the buffer layer 112, the gate insulating layer 113, and the interlayer insulating layer 114.

The plurality of upper connection lines 580 is disposed on the planarization layer 115 and the plurality of connection substrates CS. The plurality of upper connection lines 580 may refer to wiring lines which electrically connect the plurality of upper pads 570 which is adjacent to each other. In this case, the upper connection line 580 and the upper pad 570 may be connected to each other through a contact hole formed in the planarization layer 115. The plurality of upper connection lines 580 may be configured by one of various wiring lines such as a gate line, a data line, an emission signal line, a high potential power line, a low potential power line, a reference voltage line, and a compensation signal line, but is not limited thereto.

The plurality of upper connection lines 580 is disposed between two adjacent first substrates ST1 to electrically connect two first substrates ST1. Specifically, the plurality of upper connection lines 580 is disposed on the connection substrate CS which connects two adjacent first substrates ST1 and two adjacent second substrates ST2. Further, the plurality of upper connection lines 580 may be disposed between adjacent two second substrates ST2 and between the first substrate ST1 and the second substrate ST2 which are adjacent to each other.

In an area corresponding to the connection substrates CS, the plurality of upper connection lines 580 is formed to have the same shape as the plurality of connection substrates CS and the plurality of lower connection lines 520 to overlap each other. That is, the plurality of upper connection lines 580 may have the same curved shape as the plurality of connection substrates CS above the plurality of connection substrates CS. In this case, the plurality of upper connection lines 580 may be configured to transmit the same signal as the plurality of lower connection lines 520 to the plurality of sub pixels SPX. That is, a signal transmitted by the plurality of upper connection lines 580 may be the same as a signal transmitted by the plurality of lower connection lines 520.

The plurality of upper connection lines 580 includes a first upper connection line 581 and a second upper connection line 582. The first upper connection line 581 and the second upper connection line 582 may be disposed between the plurality of first substrates ST1, between the plurality of second substrates ST2, or between the plurality of first substrates ST1 and the plurality of second substrates ST2. For example, the first upper connection line 581 may be disposed between the first sub pixel SPX1 and the second sub pixel SPX2. Further, the second upper connection line 582 may be disposed between the first sub pixel SPX1 and another sub pixel SPX adjacent to the first sub pixel SPX1.

The first upper connection line 581 refers to a wiring line extending in an X axis direction among the plurality of upper connection line 580 and the second upper connection line 582 refers to a wiring line extending in a Y axis direction among the plurality of upper connection line 580. The first upper connection line 581 and the second upper connection line 582 may be configured to transmit different signals to the plurality of sub pixels SPX. That is, a signal transmitted by the first upper connection line 581 may be different from a signal transmitted by the second upper connection line 582.

In order to suppress the crack caused when the stretchable display device 500 is stretched, the plurality of upper connection lines 580 and the plurality of lower connection lines 520 may have a curved shape, for example, a sine wave shape. Accordingly, as compared with the plurality of upper connection lines 580 and the plurality of lower connection lines 520 having a linear shape, in the case of the curved shape, a line resistance may be increased.

Therefore, in the stretchable display device 500 according to still another embodiment of the present disclosure, the plurality of upper connection lines 580 and the plurality of lower connection lines 520 which overlaps the plurality of upper connection lines 580 may transmit the same electrical signal. That is, the upper connection line 580 and the lower connection line 520 which correspond to each other may be connected to each other in parallel.

Specifically, an upper pad 570 and a lower pad 530 which overlap each other, among the plurality of upper pads 570 and the plurality of lower pads 530 may be electrically connected to each other. Further, the overlapping upper connection line 580 and lower connection line 520 which are electrically connected to the overlapping upper pad 570 and lower pad 530 may be electrically connected to each other. That is, the upper connection line 580 and the lower connection line 520 may be connected in parallel by the upper pad 570 and the lower pad 530 which overlap each other. Accordingly, since the same electrical signal is transmitted to two paths through the upper connection line 580 and the lower connection line 520 so that the resistance of the upper connection line 580 and the lower connection line 520 may be reduced. As a result, in the stretchable display device 500 according to another embodiment of the present disclosure, a resistance characteristic of the upper connection line 580 and the lower connection line 520 is improved to improve power consumption and a display quality.

Stretchable Display Device Including Organic Light Emitting Diode

Figure 6:
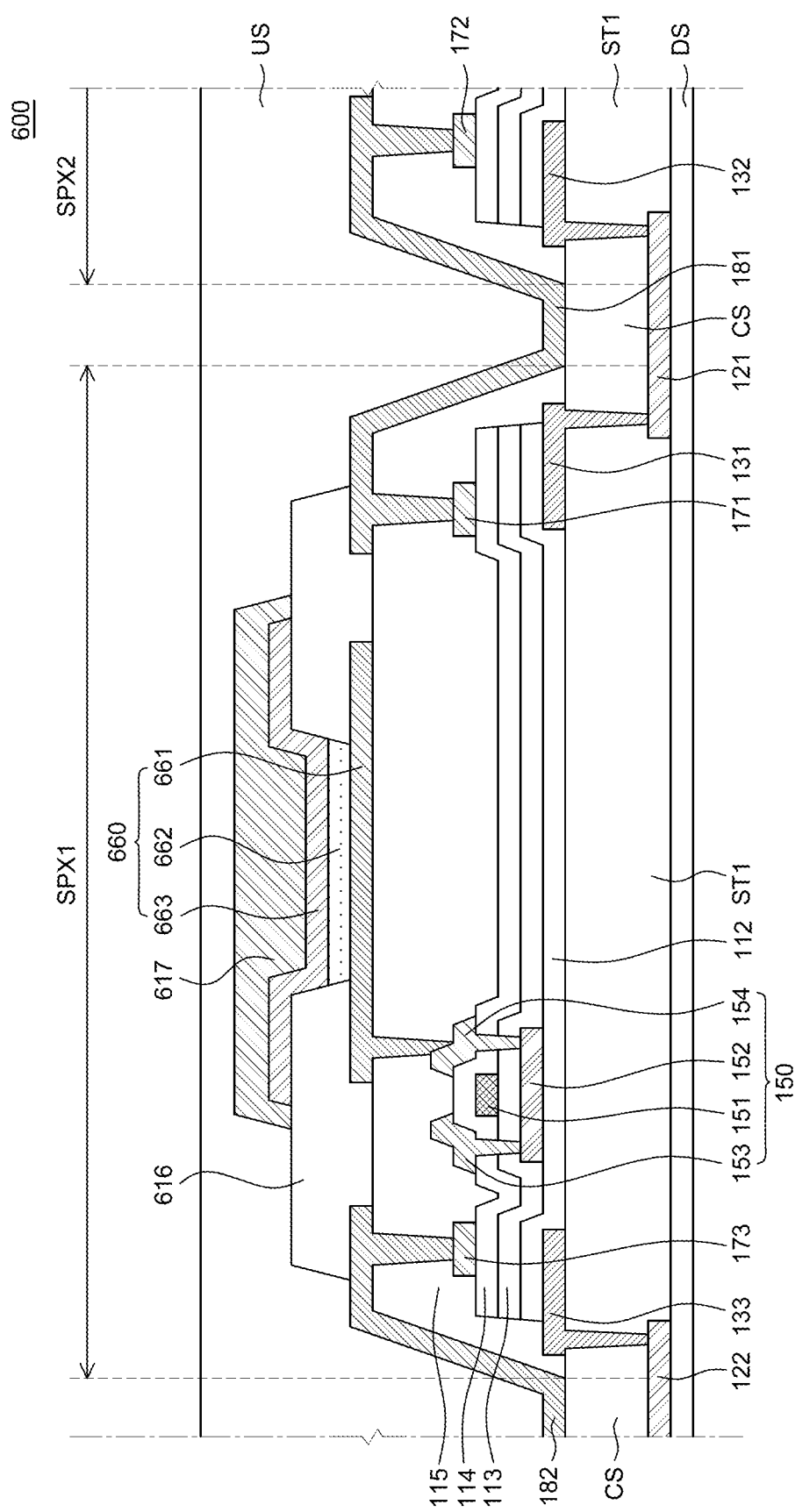
FIG. 6 is a schematic cross-sectional view of one sub pixel of a stretchable display device according to still another embodiment of the present disclosure.

FIG. 6 is a schematic cross-sectional view of one sub pixel of a stretchable display device according to still another embodiment of the present disclosure. A stretchable display device 600 of FIG. 6 is substantially the same as the stretchable display device 100 illustrated in FIGS. 1 to 3 except for an organic light emitting diode 660 and a bank 616 so that a redundant description will be omitted.

Referring to FIG. 6, an organic light emitting diode 660 is disposed to correspond to each of the plurality of sub pixels SPX and emits light having a specific wavelength band. That is, the organic light emitting diode 660 may be a blue organic light emitting diode which emits blue light, a red organic light emitting diode which emits red light, a green organic light emitting diode which emits green light, or a white organic light emitting diode which emits white light, but is not limited thereto. When the organic light emitting diode 660 is a white organic light emitting diode, the stretchable display device 600 may further include a color filter.

The organic light emitting diode 660 includes an anode 661, an organic light emitting layer 662, and a cathode 663. Specifically, the anode 661 is disposed on the planarization layer 115. The anode 661 is an electrode configured to supply holes to the organic light emitting layer 662. The anode 661 may be configured by a transparent conductive material having a high work function. Here, the transparent conductive material may include indium tin oxide (ITO), indium zinc oxide (IZO), or indium tin zinc oxide (ITZO). Further, when the stretchable display device 600 is implemented as a top emission type, the anode 661 may further include a reflector.

The anodes 661 are disposed to be spaced apart from each other for each of the sub pixels SPX to be electrically connected to the transistor 150 through a contact hole of the planarization layer 115. For example, in FIG. 6, it is illustrated that the anode 661 is electrically connected to the drain electrode 154 of the transistor 150, but the anode 661 may be electrically connected to the source electrode 153.

A bank 616 is disposed on the anode 661, the connection line 180, and the planarization layer 115. The bank 616 is a component which divides adjacent sub pixels SPX. The bank 616 is disposed to cover at least a part of both sides of the adjacent anode 661 to expose a part of a top surface of the anode 661. The bank 616 may suppress a problem in that a current is concentrated at the corner of the anode 661 to emit the light to the side surface of the anode 661 so that an unintended sub pixel SPX emits light or colors are mixed. The bank 616 may be formed of acrylic-based resin, benzocyclobutene (BCB)-based resin, or polyimide, but is not limited thereto.

The organic light emitting layer 662 is disposed on the anode 661. The organic light emitting layer 662 is configured to emit light. The organic light emitting layer 662 may include a luminescent material and the luminescent material may include a phosphorescent material or a fluorescent material, but is not limited thereto.

The organic light emitting layer 662 may be configured by one emission layer. Alternatively, the organic light emitting layer 662 may have a stack structure in which a plurality of emission layers laminated with a charge generation layer therebetween is laminated. Further, the organic light emitting layer 662 may further include at least one organic layer of a hole transport layer, an electron transport layer, a hole blocking layer, an electron blocking layer, a hole injection layer, and an electron injection layer.

Referring to FIG. 6, the cathode 663 is disposed on the organic light emitting layer 662. The cathode 663 supplies electrons to the organic light emitting layer 662. The cathode 663 may be formed of transparent conductive oxide such as indium tin oxide (ITO), indium zinc oxide (IZO), indium tin zinc oxide (ITZO), zinc oxide (ZnO), and tin oxide (TO) or ytterbium (Yb) alloy. Alternatively, the cathode 663 may be formed of a metal material.

The cathode 663 may be patterned to overlap the plurality of first substrates ST1. That is, the cathode 663 is formed only in an area overlapping the plurality of first substrates ST1 and may not be formed in an area between the plurality of first substrates ST1. Since the cathode 663 is formed of a material such as a transparent conductive oxide or a metal material, when the cathode 663 is formed in the area between the plurality of first substrates ST1, the cathode 663 may be damaged during the process of stretching the stretchable display device 600. Therefore, the cathode 663 may be formed so as to correspond to each of the plurality of first substrates ST1 on a flat surface. Referring to FIG. 6, the cathode 663 may be formed to have an area which does not overlap the area where the connection line 180 is disposed, in an area overlapping the plurality of first substrates ST1.

Unlike the general organic light emitting display device, in the stretchable display device 600 according to still another example embodiment of the present disclosure, the cathode 663 is patterned so as to correspond to the plurality of first substrates ST1. Therefore, the cathode 663 disposed on the plurality of first substrates ST1 may be independently supplied with a low potential power through the connection line 180.

Referring to FIG. 6, an encapsulation layer 617 is disposed on the organic light emitting diode 660. The encapsulation layer 617 covers the organic light emitting diode 660 and is in contact with a part of the top surface of the bank 616 to seal the organic light emitting diode 660. Therefore, the encapsulation layer 617 protects the organic light emitting diode 660 from moisture, air, or physical impact permeating from the outside.

The encapsulation layer 617 covers the cathode 663 which is patterned to overlap the plurality of first substrates ST1 and is formed in each of the plurality of first substrates ST1. That is, the encapsulation layer 617 is disposed so as to cover one cathode 663 disposed in one first substrate ST1 and the encapsulation layer 617 disposed on each of the plurality of first substrates ST1 may be spaced apart from each other.

The encapsulation layer 617 may be formed only in an area overlapping the plurality of first substrates ST1. As described above, the encapsulation layer 617 may be configured to include an inorganic layer so that the encapsulation layer may be easily cracked or damaged during a process of stretching the stretchable display device 600. Specifically, since the organic light emitting diode 660 is vulnerable to the moisture or oxygen, when the encapsulation layer 617 is damaged, the reliability of the organic light emitting diode 660 may be reduced. Therefore, in the stretchable display device 600 according to another example embodiment of the present disclosure, the encapsulation layer 617 is not formed in an area between the plurality of first substrates ST1. Therefore, even though the stretchable display device 600 is bent or stretched to be deformed, the damage of the encapsulation layer 617 may be reduced or minimized.

In the meantime, in this specification, it has been described that the LED 160 or the organic light emitting diode 660 is used as a display element, but a quantum dot light emitting diode (QLED) may also be used as the display element, and is not limited thereto.

Figure 7A:
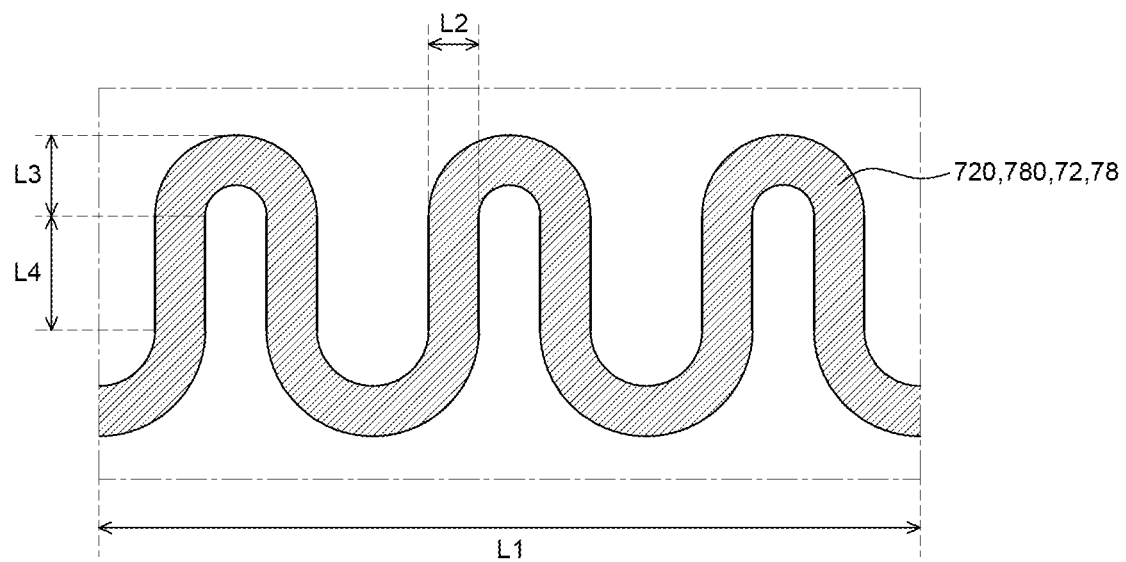
FIG. 7A is a plan view of a connection line according to a comparative embodiment and an example embodiment.
Figure 7B:
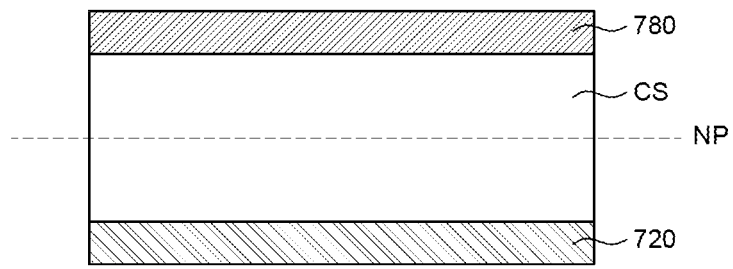
FIGS. 7B and 7C are cross-sectional views of a connection line according to a comparative embodiment and an example embodiment.
Figure 7C:
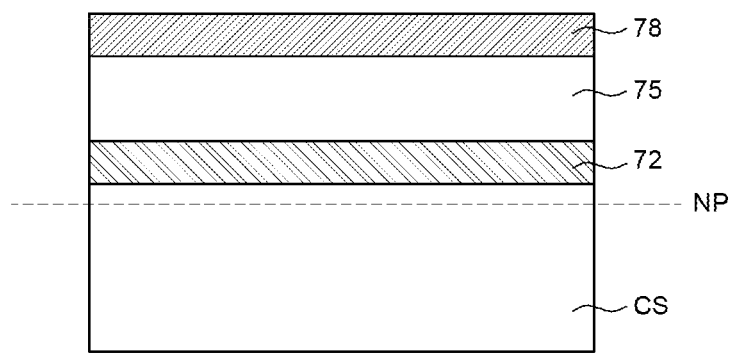
Figure 8A:
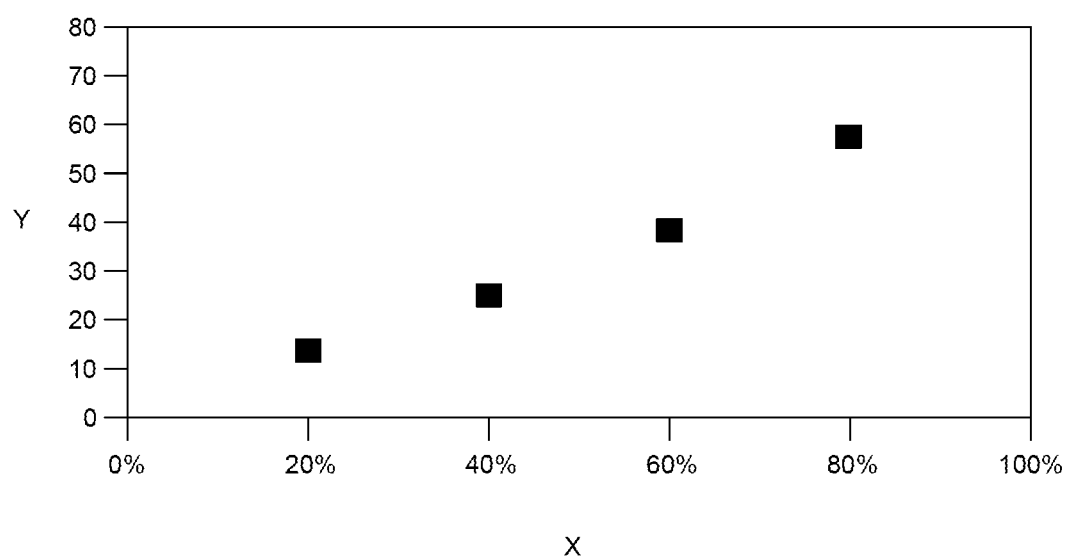
FIG. 8A is a simulation result of a stress in accordance with stretching of a connection line according to an example embodiment of FIG. 7B.
Figure 8B:
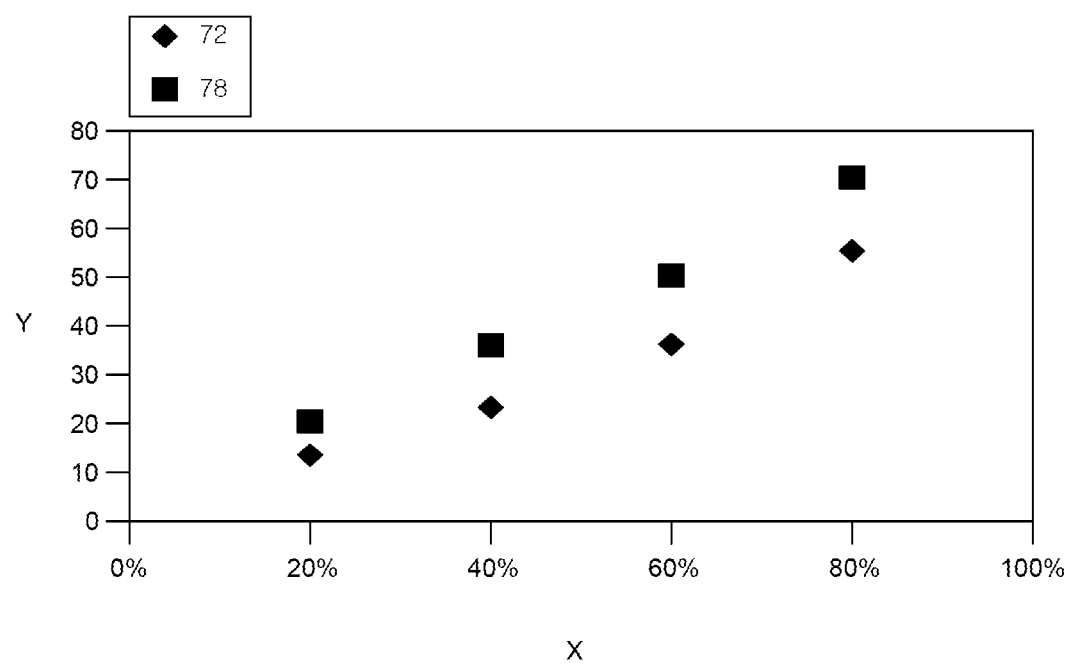
FIG. 8B is a simulation result of a stress in accordance with stretching of a connection line according to a comparative embodiment of FIG. 7C.

Comparison of Stress Between the Embodiments and Comparative Example when Connection Line Is Stretched FIG. 7A is a plan view of a connection line according to a comparative embodiment and an example embodiment. FIGS. 7B and 7C are cross-sectional views of a connection line according to a comparative embodiment and an example embodiment. FIG. 8A is a simulation result of a stress in accordance with stretching of a connection line according to an example embodiment of FIG. 7B. FIG. 8B is a simulation result of a stress in accordance with stretching of a connection line according to a comparative embodiment of FIG. 7C.

FIG. 7A illustrates a shape of connection lines 720, 780, 72, or 78 before being stretched. In FIG. 7A, only the connection lines 720, 780, 72, and 78 disposed on the connection substrate CS are illustrated. Here, in both the comparative embodiment and the example embodiment, a planar shape before being stretched is the same, so that the planar shape is illustrated in one drawing. Further, upper connection lines 780 and 78 and lower connection lines 720 and 72 overlap with the same shape so that in FIG. 7A which is a plan view, the upper connection lines 780 and 78 and the lower connection lines 720 and 72 are illustrated as one wiring line. The connection lines 720 and 780 according to the example embodiment of FIGS. 7A and 7B may be the same as the connection lines illustrated in FIGS. 1 to 6. In FIGS. 8A and 8B, an X axis indicates an extension rate and a Y axis indicates a stress (kPa).

First, referring to FIGS. 7A and 7B, in order to obtain a simulation result of a stress value in accordance with an extension rate of a connection line according to an embodiment of the present disclosure, the upper connection line 780 and the lower connection line 720 were disposed above and below the connection substrate CS, respectively. In this case, the connection substrate CS was formed of polyimide and the connection lines 720 and 780 were formed of copper.

For the purpose of simulation of the connection lines according to the example embodiment, referring to FIG. 7A, a length L1 of an area in which the upper connection line 780 was disposed was set to 176 µm in a horizontal direction. That is, a shortest distance between one end and the other end of the upper connection line 780 was set to 176 µm. A width L2 of the upper connection line 780 was set to 8 µm. In a vertical direction, a length L3 of a curved area of the upper connection line 780 was set to 14 µm. That is, a shortest distance between an upper end and a lower end of the curved area of the upper connection line 780 was set to 14 µm. Further, in a vertical direction, a length L4 of a straight line area of the upper connection line 780 was set to 20 µm.

In the meantime, in an area corresponding to the connection substrate CS, all the upper connection line 780, the lower connection line 720, and the connection substrate CS may overlap with the same shape. Therefore, planar shapes of the lower connection line 720 and the connection substrate CS were set to have the same condition as the upper connection line 780 as described above.

Referring to FIG. 7B, a thickness of the lower connection line 720 and the upper connection line 780 was set to 1 µm. Further, a thickness of the connection substrate CS was set to 6 µm.

Referring to FIG. 7B, in a condition for the simulation of the connection line according to the embodiment of the present disclosure, a neutral plane NP is located in an intermediate point of a total area formed by the lower connection line 720, the connection substrate CS, and the upper connection line 780. That is, the lower connection line 720 and the upper connection line 780 were disposed to be spaced apart from each other to an upper portion and a lower portion of the neutral plane with the same interval. In the meantime, the neutral plane refers to a plane with a bending stress of zero.

Referring to FIGS. 7A and 7C, in order to obtain a simulation result of a stress value in accordance with an extension rate of the connection line according to the comparative embodiment, the connection substrate CS, the lower connection line 72, a planarization layer 75, and the upper connection line 78 were configured. Specifically, the connection substrate CS was disposed and the lower connection line 72 and the upper connection line 78 were disposed above and below the planarization layer 75, above the connection substrate CS. In this case, the connection substrate CS was formed of polyimide and the connection lines 720 and 780 were formed of copper.

For the purpose of simulation of the connection line according to the comparative embodiment, referring to FIG. 7A, planar shapes of the connection substrate CS, the lower connection line 72, the planarization layer 75, and the upper connection line 78 were set to be the same as the above-described condition for the simulation of the connection line according to the embodiment.

Referring to FIG. 7C, a thickness of the lower connection line 72 and the upper connection line 78 was set to 1 µm. Further, a thickness of the connection substrate CS was set to 6 µm. Further, a thickness of the planarization layer 75 was set to 2.5 µm.

Referring to FIG. 7C, in a condition for the simulation of the connection line according to the comparative embodiment, a neutral plane NP is located in an intermediate point of a total area formed by the connection substrate CS, the lower connection line 72, the planarization layer 75, and the upper connection line 78. That is, the neutral plane NP is located in an area corresponding to the connection substrate CS. Accordingly, in the comparative, both the lower connection line 72 and the upper connection line 78 were located above the neutral plane.

Referring to FIG. 8A, a simulation result of a stress value in accordance with an extension rate of the connection lines 720 and 780 according to the example embodiment of FIGS. 7A and 7B was confirmed. Specifically, when the connection lines 720 and 780 according to the embodiment were stretched, if an extension rate was 20%, a stress was between 10 kPa and 20 kPa. Further, if an extension rate was 40%, a stress was between 20 kPa and 30 kPa, if an extension rate was 60%, a stress was between 30 kPa and 40 kPa, and if an extension rate was 80%, a stress was between 50 kPa and 60 kPa.

According to the example embodiment of the present disclosure, the lower connection line 720 and the upper connection line 780 were disposed to be spaced apart from each other with respect to the neutral plane NP with the same interval. Therefore, the stresses generated in the lower connection line 720 and the upper connection line 780 may be equal to each other. Accordingly, when the connection lines 720 and 780 according to the example embodiment of the present disclosure were stretched, even though the lower connection line 720 and the upper connection line 780 were twisted in a three-dimensional structure, a better stability may be achieved.

Referring to FIG. 8B, a simulation result of a stress value in accordance with an extension rate of the connection lines 72 and 78 according to the comparative embodiment of FIGS. 7A and 7C were confirmed. Specifically, when the connection lines 72 and 78 according to the comparative embodiment were stretched, it was confirmed that a stress generated in the upper connection line 78 disposed at the outside was larger than a stress applied to the lower connection line 72 disposed at the inside. That is, the neutral plane NP was closer to the lower connection line 72 than the upper connection line 78, so that stresses generated in the upper connection line 78 and the lower connection line 72 may be different from each other. Further, it was understood that a greater stress may be generated in the upper connection line 78 which is farther from the neutral plane NP than the lower connection line 72. Specifically, it was confirmed that with respect to the upper connection line 78, if the extension rate was 20%, a stress was approximately 20 kPa, if the extension rate was 40%, a stress was between 30 kPa and 40 kPa, if the extension rate was 60%, a stress was approximately 50 kPa, and if the extension rate was 80%, a stress was approximately 70 kPa.

Referring to FIGS. 8A and 8B, according to the example embodiment of FIG. 7B, a similar stress was generated in the upper connection line 780 and the lower connection line 720. In contrast, according to the comparative embodiment of FIG. 7C, different stresses were generated in the upper connection line 78 and the lower connection line 72. Further, it was understood that a stress generated in the connection line when the connection lines 72 and 78 according to the comparative embodiment of FIG. 7C were stretched may be much larger than the stress generated when the connection lines 720 and 780 according to the example embodiment of FIG. 7B were stretched. Therefore, it was understood that the connection lines 720 and 780 according to the example embodiment of FIG. 7B were more advantageous than the connection lines 72 and 78 according to the comparative embodiment of FIG. 7C in terms of the stress generated in the connection line. In other words, it was understood that when the upper connection line 780 and the lower connection line 720 are disposed above and below the connection substrate CS, the stresses applied to the connection lines 720 and 780 are reduced or minimized.

The example embodiments of the present disclosure can also be described as follows:

According to an aspect of the present disclosure, there is provided a stretchable display device. The stretchable display device includes a lower substrate including a display area and a non-display area. The stretchable display device further includes a plurality of lower connection lines on the lower substrate. The stretchable display device further includes a plurality of first substrates disposed on the display area, the plurality of first substrates defines sub pixels, and a modulus of the plurality of first substrates is larger than a modulus of the lower substrate. The stretchable display device further includes a plurality of connection substrates connecting adjacent first substrates among the plurality of first substrates. The stretchable display device further includes a plurality of upper connection lines disposed on the plurality of connection substrates.

The plurality of lower connection lines and the plurality of upper connection lines may electrically connect adjacent first substrates among the plurality of first substrates.

The plurality of connection substrates may be disposed on the plurality of lower connection lines.

The plurality of lower connection lines, the plurality of connection substrates, and the plurality of upper connection lines may overlap each other.

The stretchable display device may further include a plurality of first upper pads and a plurality of second upper pads which are electrically connected to one end and the other end of the plurality of upper connection lines, respectively and a plurality of first lower pads and a plurality of second lower pads which are electrically connected to one end and the other end of the plurality of lower connection lines which overlaps the plurality of upper connection lines, respectively.

The stretchable display device may further include a plurality of first pads and a plurality of second pads which are electrically connected to one end and the other end of the plurality of upper connection lines, respectively. One end and the other end of the plurality of lower connection lines which overlaps the plurality of upper connection lines may be electrically connected to the plurality of first pads and the plurality of second pads, respectively.

The stretchable display device may further include a plurality of second substrates disposed on the non-display area and a modulus of the plurality of second substrates is larger than the modulus of the lower substrate. The plurality of connection substrates may connect adjacent second substrates among the plurality of second substrates or a first substrate and a second substrate which are adjacent to each other, among the plurality of first substrates and the plurality of second substrates.

The plurality of lower connection lines and the plurality of upper connection lines may electrically connect adjacent second substrates among the plurality of second substrates or a first substrate and a second substrate which are adjacent to each other, among the plurality of first substrates and the plurality of second substrates.

The stretchable display device may further include a plurality of inorganic insulating layers disposed on the plurality of first substrates and an organic insulating layer disposed on the plurality of first substrates so as to cover a top surface and a side surface of the plurality of inorganic insulating layers. The plurality of upper connection lines may be disposed on the organic insulating layer and the plurality of connection substrates.

According to another aspect of the present disclosure, there is provided a stretchable display device. The stretchable display device includes a flexible substrate including a display area and a non-display area. The stretchable display device further includes a plurality of rigid substrates disposed in the display area or the non-display area. The stretchable display device further includes a plurality of connection substrates connecting the plurality of rigid substrates between the plurality of rigid substrates. The stretchable display device further includes a plurality of lower connection lines disposed below the plurality of connection substrates. The stretchable display device further includes a plurality of upper connection lines disposed above the plurality of connection substrates so as to overlap the plurality of lower connection lines.

The plurality of lower connection lines and the plurality of upper connection lines may electrically connect adjacent rigid substrates among the plurality of rigid substrates.

The plurality of lower connection lines and the plurality of upper connection lines may be configured to transmit different electrical signals.

The plurality of lower connection lines and the plurality of upper connection lines may be configured to transmit the same electrical signal.

A modulus of the plurality of rigid substrates is larger than a modulus of the flexible substrate.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A stretchable display device, comprising:
   a lower substrate including a display area and a non-display area;
   a plurality of lower connection lines on the lower substrate;

a plurality of first substrates on the display area, wherein the plurality of first substrates including sub pixels, and a modulus of the plurality of first substrates is larger than a modulus of the lower substrate;

a plurality of connection substrates connecting adjacent first substrates among the plurality of first substrates; and a plurality of upper connection lines on the plurality of connection substrates.

2. The stretchable display device according to claim 1, wherein the plurality of lower connection lines and the plurality of upper connection lines electrically connect adjacent first substrates among the plurality of first substrates.

3. The stretchable display device according to claim 1, wherein the plurality of connection substrates is on the plurality of lower connection lines.

4. The stretchable display device according to claim 1, wherein the plurality of lower connection lines, the plurality of connection substrates, and the plurality of upper connection lines overlap with each other.

5. The stretchable display device according to claim 4, further comprising:
a plurality of first upper pads which are electrically connected to one end of the plurality of upper connection lines, respectively;
a plurality of second upper pads which are electrically connected to the other end of the plurality of upper connection lines, respectively;
a plurality of first lower pads which are electrically connected to one end of the plurality of lower connection lines, respectively which overlaps with the plurality of upper connection lines; and
a plurality of second lower pads which are electrically connected to the other end of the plurality of lower connection lines, respectively which overlap with the plurality of upper connection lines.

6. The stretchable display device according to claim 4, further comprising:
a plurality of first pads and a plurality of second pads which are electrically connected to one end and the other end of the plurality of upper connection lines, respectively,
wherein one end and the other end of the plurality of lower connection lines which overlaps with the plurality of upper connection lines are electrically connected to the plurality of first pads and the plurality of second pads, respectively.

7. The stretchable display device according to claim 1, further comprising:
a plurality of second substrates on the non-display area, wherein a modulus of the plurality of second substrates is larger than the modulus of the lower substrate,
wherein the plurality of connection substrates either connects adjacent second substrates among the plurality of second substrates or connects a first substrate among the plurality of first substrates and a second substrate among the plurality of second substrates which are adjacent to each other.

8. The stretchable display device according to claim 7, wherein the plurality of lower connection lines and the plurality of upper connection lines either electrically connect adjacent second substrates among the plurality of second substrates or electrically connect a first substrate among the plurality of first substrates and a second substrate among the plurality of second substrates which are adjacent to each other.

9. The stretchable display device according to claim 1, further comprising:
a plurality of inorganic insulating layers on the plurality of first substrates; and
an organic insulating layer on the plurality of first substrates so as to cover a top surface and a side surface of the plurality of inorganic insulating layers,
wherein the plurality of upper connection lines is on the organic insulating layer and the plurality of connection substrates.

10. A stretchable display device, comprising:
a flexible substrate having thereon a display area and a non-display area;
a plurality of substantially rigid substrates disposed in either the display area or the non-display area;
a plurality of connection substrates interposed among the plurality of rigid substrates and connecting the plurality of rigid substrates;
a plurality of lower connection lines disposed below the plurality of connection substrates; and
a plurality of upper connection lines disposed above the plurality of connection substrates so as to overlap with the plurality of lower connection lines.

11. The stretchable display device according to claim 10, wherein the plurality of lower connection lines and the plurality of upper connection lines electrically connect adjacent rigid substrates among the plurality of rigid substrates.

12. The stretchable display device according to claim 10, wherein the plurality of lower connection lines and the plurality of upper connection lines are configured to transmit different electrical signals.

13. The stretchable display device according to claim 10, wherein the plurality of lower connection lines and the plurality of upper connection lines are configured to transmit substantially the same electrical signal.

14. The stretchable display device according to claim 10, wherein a modulus of the plurality of rigid substrates is larger than a modulus of the flexible substrate.

15. A stretchable display device, comprising:
a flexible base substrate having formed thereon a display area and a non-display area adjacent to the display area;
a plurality of first substrates on the display area of the flexible base substrate, wherein each of the first substrate of the plurality of first substrates includes at least one subpixels, and each of the first substrate is spaced apart from each other;
a plurality of lower connection lines interposed between and connecting neighboring first substrates, the plurality of lower connection lines on the flexible base substrate;
a plurality of connection substrates on the plurality of lower connection lines, respectively; and
a plurality of upper connection lines on the plurality of connection substrates, respectively,
wherein a lower connection line of the plurality of lower connection lines has a first area, and an upper connection line of the plurality of upper connection lines has a second area equal to or smaller than the first area.

16. The stretchable display device according to claim 15, wherein the plurality of upper connection lines have substantially the same shape as the plurality of connection substrates and the plurality of lower connection lines that overlap with each other.

17. The stretchable display device according to claim 15, wherein a modulus of the plurality of first substrates is larger than a modulus of the flexible base substrate.

18. The stretchable display device according to claim 15, wherein the plurality of lower connection lines and the plurality of upper connection lines are configured to transmit different electrical signals.

19. The stretchable display device according to claim 15, wherein the plurality of lower connection lines and the plurality of upper connection lines are configured to transmit substantially the same electrical signal.

\* \* \* \* \*